(12) United States Patent
Timmerhoff

(10) Patent No.: US 8,195,437 B2
(45) Date of Patent: Jun. 5, 2012

(54) SYSTEMS POWER DISTRIBUTION TOOL

(75) Inventor: Richard L. Timmerhoff, Sahuarita, AZ (US)

(73) Assignee: Raytheon Company, Waltham, MA (US)

( * ) Notice: Subject to any disclaimer, the term of this patent is extended or adjusted under 35 U.S.C. 154(b) by 342 days.

(21) Appl. No.: 12/573,096

(22) Filed: Oct. 3, 2009

(65) Prior Publication Data

US 2011/0082682 A1    Apr. 7, 2011

(51) Int. Cl.
*G06F 17/50* (2006.01)
(52) U.S. Cl. ............ 703/5; 703/17; 716/4; 716/5; 716/6
(58) Field of Classification Search .................. 703/17, 703/6; 716/5, 6
See application file for complete search history.

(56) References Cited

U.S. PATENT DOCUMENTS

| | | | |
|---|---|---|---|
| 5,359,711 A | 10/1994 | Hartmann et al. | |
| 5,933,358 A | 8/1999 | Koh | |
| 6,311,147 B1 | 10/2001 | Tuan | |
| 6,385,565 B1 | 5/2002 | Anderson | |
| 6,523,154 B2 | 2/2003 | Cohn | |
| 6,631,502 B2 | 10/2003 | Buffet | |
| 6,868,374 B1 | 3/2005 | Ditlow | |
| 7,013,254 B2 | 3/2006 | Gauthier | |
| 7,292,900 B2 | 11/2007 | Kreidler | |
| 7,509,596 B2 | 3/2009 | Koo | |
| 2002/0199160 A1 | 12/2002 | Fujine | |
| 2009/0031264 A1 | 1/2009 | Rittman et al. | |

*Primary Examiner* — Thai Phan
(74) *Attorney, Agent, or Firm* — Eric A. Gifford

(57) ABSTRACT

A systems power distribution tool integrates the design of the power source and distribution network to provide a robust interconnect topology and power source. This is accomplished with a machine of one or more computing devices configured as a systems power distribution tool. The tool "pulls" load current from the source through interconnects to the loads. This allows the interconnects to be designed to satisfy derating conditions for worst case voltage and current conditions and the power source to be designed to source the loads under actual conditions without margin stacking.

25 Claims, 18 Drawing Sheets

$V_{NODE\ N} = V_{NODE\ N-1} - I_{NODE\ N-1} * (R_{HARNESS} + R_{PINS})$ $V_{RADIO} = (V_{NODE\ 1} + (SQRT(V_{NODE\ 1}^2 - 4*P_{UNIT}*(R_{HARNESS} + R_{PINS})))/2$ $I_{LOAD} = P_{LOAD}/V_{LOAD}$

| TIME | CURRENT | VCAP | VRBATT | BATTERY VOUT | RADIO I | RADIO V | RADIO P | SEEKER I | SEEKER V | SEEKER P | PCU I | PCU V | PCU P | MODE | MODE |
|---|---|---|---|---|---|---|---|---|---|---|---|---|---|---|---|
| 0 | 0 | START | START | START | | | | | | | | | | MIN SS | BIT |
| .1 | 2 | .4 | .1 | 37 | | | | | | | | | | BIT SS | STD-BY |
| .7 | 12 | .9 | .1 | 36 | | | | | | | | | | NOM TX | LAUNCH |
| 5 | 10 | .3 | .2 | 35.5 | | | | | | | | | | MAX SS | FLIGHT |
| 16 | 15 | .3 | .2 | 35 | | | | | | | | | | NOM SS | FLIGHT |
| 21 | 5 | .75 | .25 | 34 | | | | | | | | | | NOM TX | FLIGHT |
| 32 | 23 | .7 | .3 | 33 | | | | | | | | | | NOM SS | FLIGHT |
| 76 | 26 | .4 | .1 | 28 | | | | | | | | | | NOM TX | FLIGHT |
| 100 | 33 | .7 | .3 | 27 | | | | | | | | | | MAX SS | ENDGAME |

BATTERY DEPLETION PROCESSOR — TOPOLOGY PROCESSOR — MODE OF OPERATION

FIG. 8a

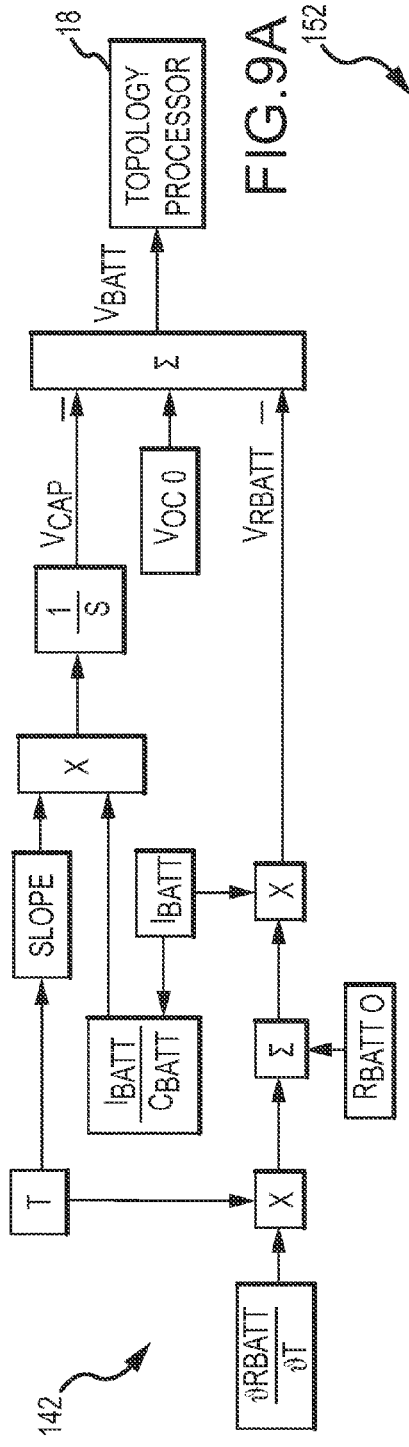

FIG.9A

| PARAMETER DESCRIPTION | SYMBOL | STARTING VALUE | UNITS | NOTES |
|---|---|---|---|---|
| ELAPSED TIME | T | 0 | SEC | 0 SEC TO END OF TIME LINE |
| BATTERY RESISTANCE AT T=0 | RBATT 0 | 0.05 | Ω | BATTERY DATA SHEET OR BATTERY DATA |
| INITIAL BATTERY OPEN CIRCUIT VOLTAGE | VOC 0 | > CIRCUIT MIN V | V | CALCULATED FROM CIRCUIT TOPOLOGY |
| BATTERY CHARGE CAPACITANCE | CBATT | MODEL DEFINED | FARADS | BATTERY DATA SHEET OR BATTERY DATA |
| BATTERY RESISTANCE TIME DERIVATIVE | $\partial RBATT/\partial T$ | 0.00001 | Ω/SEC | BATTERY DATA SHEET OR BATTERY DATA |
| LAPLACE OPERATOR | S | 0 | 1/SEC | INTEGRATION |
| SUMMING JUNCTION | Σ | — | — | ADDS AND/OR SUBTRACTS INPUTS |
| PRODUCT JUNCTION | X | — | — | MULTIPLIES INPUTS |
| BATTERY CURRENT | IBATT | MODEL DEFINED | AMPS | MODEL CALCULATED: LOAD DEPENDANT |
| BATTERY VOLTAGE | VBATT | MODEL DEFINED | VOLTS | MODEL CALCULATED: LOAD DEPENDANT |
| BATTERY DISCHARGE SLOPE WITH TIME | SLOPE | 1 | — | BATTERY DATA SHEET OR BATTERY DATA |

Table 250:

| IPCU | VPCU | WPCU | BATTERY | RADIO | SEEKER | PCU |
|---|---|---|---|---|---|---|
| I | V | W | W | | | |
| 1.0 A | 28.74 V | 30 WUNIT | 30.1 WBATT | BIT | BIT | BIT |
| 1.4 A | 28.59 V | 40 WUNIT | 40.2 WBATT | RX | LAUNCH | LAUNCH |
| 10.2 A | 27.63 V | 40 WUNIT | 1991.5 WBATT | RX | LAUNCH | LAUNCH |
| 10.2 A | 27.62 V | 40 WUNIT | 1990.9 WBATT | TX | LAUNCH | LAUNCH |
| 1.4 A | 28.28 V | 40 WUNIT | 40.3 WBATT | RX | LAUNCH | LAUNCH |
| 5.4 A | 27.56 V | 150 WUNIT | 152.4 WBATT | RX | FLYOUT | FLYOUT |
| 5.4 A | 27.55 V | 150 WUNIT | 152.4 WBATT | RX | FLYOUT | FLYOUT |
| 5.4 A | 27.54 V | 150 WUNIT | 152.4 WBATT | RX | FLYOUT | FLYOUT |

252: PCU CONNECTOR 1 — FLEX HARNESS — CONNECTOR 2 (256)

RED
GREEN

Table 254 / 258:

| NUMBER OF TRACES | COPPER WIDTH | COPPER WEIGHT | COPPER LENGTH | RESISTANCE HOT | RESISTANCE COLD | VOLTAGE HOT | VOLTAGE COLD | TEMP RISE |
|---|---|---|---|---|---|---|---|---|
| 1 TRACES | 0.2 WIDTH | 1 CPW | 22.0 LONG | 0.065 HOTΩ | 0.042 COLDΩ | 0.265 VDROP | 0.169 VDROP | 15 °C RISE |
| 1 TRACES | 2.0 WIDTH | 1 CPW | 5.0 LONG | 0.001 HOTΩ | 0.001 COLDΩ | 0.004 VDROP | 0.005 VDROP | 1 °C RISE |
| 1 TRACES | 0.1 WIDTH | 1 CPW | 7.9 LONG | 0.072 HOTΩ | 0.072 COLDΩ | 0.292 VDROP | 0.292 VDROP | 97 °C RISE |
| 1 TRACES | 2.0 WIDTH | 1 CPW | 30.0 LONG | 0.007 HOTΩ | 0.007 COLDΩ | 0.028 VDROP | 0.028 VDROP | 1 °C RISE |
| | | | TOTALS | 0.291 HOTΩ | 0.244 COLDΩ | 1.177 VDROP | 0.988 VDROP | |

SYSTEMS POWER DISTRIBUTION TOOL

GOVERNMENT RIGHTS

This invention was made with United States Government support under Contract number W31P4Q-04-C-0059 with the Department of the Army. The United States Government has certain rights in this invention.

BACKGROUND OF THE INVENTION

1. Field of the Invention

This invention relates to simulation modeling and analysis of power distribution in electrical systems and more particularly to a machine comprising one or more computing devices configured as a systems power distribution tool for use with event-driven systems that include a topology of power sources, resistive physical interconnects and event-driven fixed power loads.

2. Description of the Related Art

Electrical systems may be characterized as including a power source, electrical loads and a network of physical interconnects to distribute power from the source to the various loads. These systems may be static or single-event in which the load conditions are fixed throughout the timeline. More typically, the systems are dynamic including multiple events in which the load conditions change with time. Most of the loads are fixed-power loads in which the load power is fixed for a given event but may vary with the different events. Systems may also include fixed current or fixed resistance loads. The power source is typically either a fixed-voltage source or a depletion-voltage source (e.g. a battery). Some systems utilize a fixed-voltage source for a portion of the timeline and a battery for the remainder. These systems may range from designs of buildings, ships, aircraft, missiles, solar cars, cell phones etc.

In general, each load has a specified operating voltage and a margin that defines both under and over voltage conditions for the load. Above the over voltage threshold the load may be damaged. Below the under voltage threshold the load will not function properly. Each interconnect has a resistance and a current derating value above which the interconnect may be damaged (e.g. burn up). A power source is characterized by its source voltage and possibly its peak current, peak power or total current capabilities.

The system designers task is to design a power source and robust and preferably balanced interconnect topology that distributes power to the electrical loads subject to other constraints on the system. These constraints can range from very specific such as requiring the use of certain existing interconnects, specifying input and output impedance, peak power constraints etc. to more general such as reducing size, weight, total power and cost.

The standard design methodology is to select a source voltage and allocate a certain voltage drop for the physical interconnects to set the load voltages to "push" the current required to power the loads. The interconnect and load designers separately design to their specifications. Interconnect designers design the interconnects to satisfy the derating criterial based on the nominal load voltages and allocated drops. Their focus is to save weight and reduce cost. The load designers specify their worst case loads. The power source designers use these worst case loads to form the output power specification for the source.

When the power source, distribution network and loads are integrated a variety of problems are exposed. Often the interconnect topology is not robust, some of the interconnects will fail derating under actual operating conditions. The distribution network may not provide proper voltages to the loads causing both under and over voltage conditions. Over voltages may be addressed by adding a pre-compensator to the load but this expends resources. The power source is often over designed due to 'margin stacking' of the worst case loads. The process to redesign the separate components and reintegrate the system is time consuming and costly and often produces a sub-optimal or unbalanced system.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a systems power distribution tool that integrates the design of the power source and distribution network to provide a robust interconnect topology and power source. The tool may be configured to provide a minimal robust interconnect topology and/or minimal power source.

This is accomplished with a machine of one or more computing devices configured as a systems power distribution tool. The tool "pulls" load current from the source through interconnects to the loads. This allows the interconnects to be designed to satisfy derating conditions for worst case voltage and current conditions and the power source to be designed to source the loads under actual conditions without margin stacking.

In an embodiment, a machine for simulating power distribution from a power source in an electrical system over a sequence of one or more events comprises a plurality of building block modules implemented on a computing device. Each module includes an interconnect resistance for one or more series-connected physical interconnects and one or more event-driven fixed-power levels for a single load. A current meter for each physical interconnect calculates a current derating value based on interconnect design parameters and provides an indicator of whether a load current exceeds the current derating value. A volt meter provides an indicator of whether a load voltage meets an under voltage specification and an over voltage specification for the load. The topology and building blocks with their current and volt meters may be displayed to a user. The indicators may also be displayed to the user via, for example, different colors. A voltage drop meter may also provide a measure of the voltage drops across each interconnect, which may also be displayed to the user. Building block modules sans the voltmeter may be provided for the physical interconnects that distribute power from the source to the rest of the network. The computing device may comprise a memory for storing the interconnect design parameters and load conditions and a processor for computing current derating values, computing interconnect resistances and generating the indicators.

A topology processor interconnects a power source model with the plurality of building blocks at nodes into an electrical topology for the electrical system. The processor applies a source voltage to the topology and calculates load voltages and load currents pulled from the power source through interconnects to the nodes for a single event. The power source may be modeled in a fixed or depletion voltage mode. By "pulling" load current from the source the processor can iteratively solve the load currents and voltages for all of the loads and interconnects simultaneously for a given event.

A system processor provides the topology processor with source voltages and the event-driven fixed power levels for each event in the sequence and monitors the current meters and voltage meters to determine a source voltage for the power source so that the load voltages satisfy the under voltage specifications for all events in the sequence and monitors the current meters to adjust the interconnect design parameters so that the load currents do not exceed the current derating values for all events in the sequence.

In an embodiment, the system processor executes a first phase in which each building block is simulated under conditions that stress the derating of the interconnects in that particular building block. The system processor adjusts the interconnect design parameter to satisfy the derating requirements. The system then executes a second phase in which the entire sequence of events are simulated to select a source voltage that satisfies the under and over voltage specifications. The system processor may monitor the current meters to address any residual derating issues or to relax the interconnect design parameters under actual operating conditions while still satisfying derating. The system processor outputs the robust interconnect topology and specifications of the power source. The system processor may also report out any loads that over voltage, any interconnects that derate (if constrained by designer), a list of interconnect current derating values and the maximum load currents actually seen and a list of loads and the minimum and maximum load voltages actually seen.

In an embodiment of the first phase, for each building block in the topology, the system processor presents a worst case event for that load to the topology processor and monitors the voltmeter while iterating the source voltage to find a source voltage whereby the load voltages satisfy the under and over voltage specifications for the selected worst case event. To a first order, the worst case event is the subset of events in which that load is set at maximum power. To a second order, the worst case event is the one event in the subset with the maximum total power. To apply maximum stress to interconnects, the system processor may iterate until the minimum source voltage that satisfies the specifications is found. At the selected source voltage, the system processor monitors the current meter for each interconnect for that building block and if the load current exceeds one or more of the current derating values adjusts the design parameters of the corresponding one or more interconnects to satisfy the respective current derating values. The system processor may identify and possibly relax the design parameters of any overdesigned interconnects. The system processor may also adjust the design parameters to reduce any large voltage drops across interconnects to provide a more balanced system.

In an embodiment of the second phase, the system processor simulates all of the events in the sequence to select the source voltage that satisfies the under and over voltage specifications. The system processor may be configured to find the minimum source voltage that satisfies the specifications. For a single-event sequence, the source voltage may be the source voltage found in the first phase. For a multiple-event sequence with a fixed-voltage source, the source voltage may be the maximum of the source voltages found in the first phase for the different loads. For a multiple-event sequence with a depletion-voltage source, the system processor iterates the simulation of all of the events to find a source voltage that satisfies the load voltage specifications. A first approach is to find an initial source voltage whereby the depleted source voltage at the completion of the events is at least the maximum of the source voltages from phase one. A second approach is to monitor the voltmeters as the events are processed to identify an initial source voltage that satisfies the under and over voltage specifications. A third approach is to monitor the voltmeters as the events are processed to identify the minimum initial source voltage that satisfies the voltage specifications on the loads.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 9a and 9b are a diagram of and parameter table for the battery depletion model;

FIG. 12 is a diagram of the topology illustrating a interconnect derating for the PCU and drop down window that displays the current meter for the derated interconnect;

DETAILED DESCRIPTION OF THE INVENTION

Figure 1:
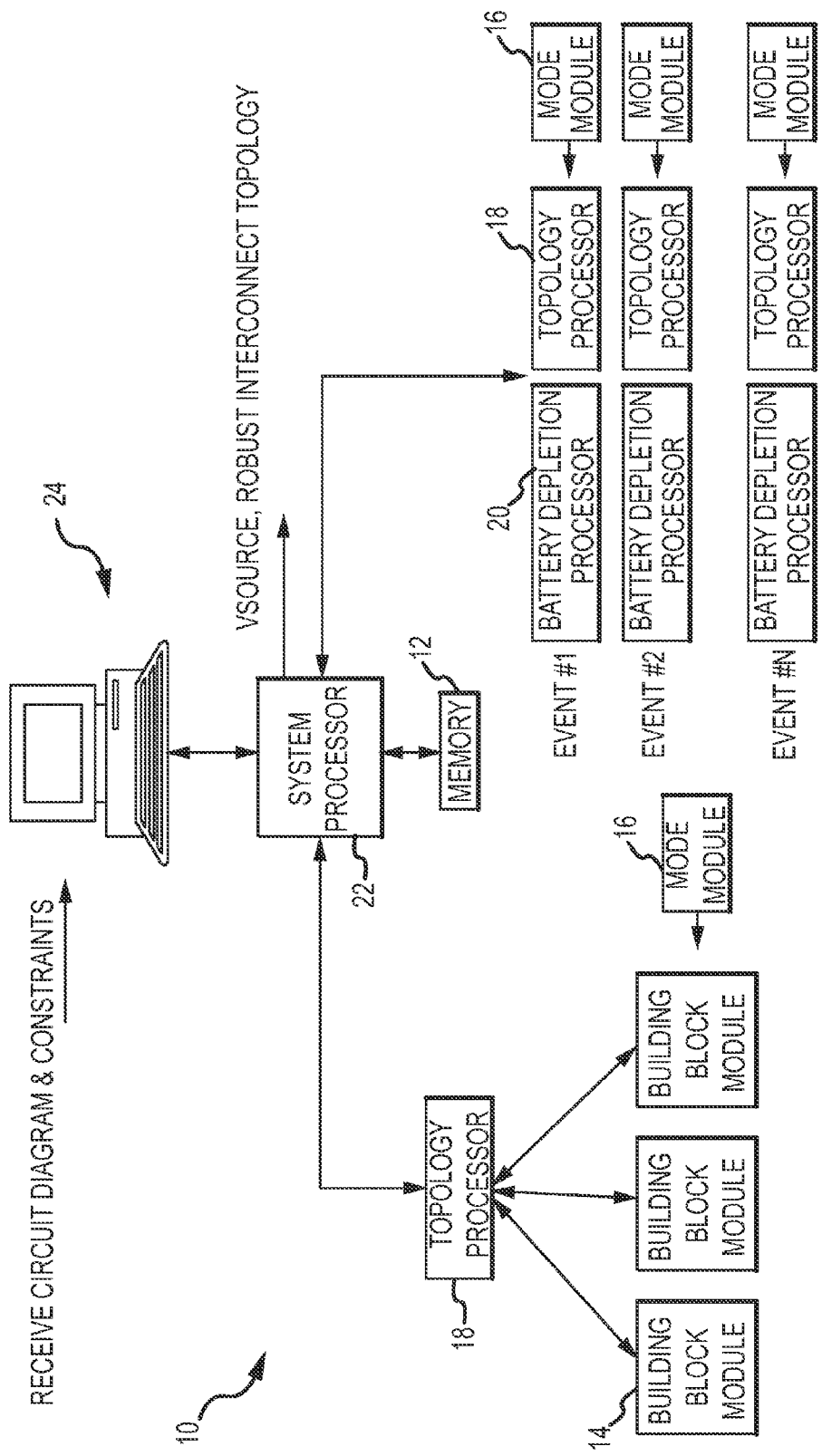
FIGS. 1 and 2 are a hardware block and flow diagram of the system power distribution tool, respectively.

The present invention describes a systems power distribution tool that integrates the design of the power source and distribution network to provide a robust and balanced interconnect topology and power source. The tool may be configured to provide a minimal robust interconnect topology or minimal power source. The tool "pulls" load current from the source through interconnects to the loads. This allows the interconnects to be designed to satisfy derating conditions for worst case voltage and current conditions and the power source to be designed for actual conditions without margin stacking. The tool is implemented as a particular machine configured from one or more computing devices including memory and processors. The tool may be implemented using an application program such as Microsoft Excel®. The tool configures the application program and the computing devices to define a particular machine for performing power distribution analysis.

In reference to FIGS. 1-7, a machine 10 configured from one or more computing devices including memory 12 and processors provides a systems power distribution tool that provides for the integrated design of a power source and an interconnect topology for distributing power to electrical loads. It is to be understood the computing devices given different functional designations for purposes of description such as "building block module 14", "mode module 16", "topology processor 18", "battery depletion processor 20" and "system processor 22" may be implemented on independent processors, a combination or processors or implemented on a single processor. Memory 12 may be a single memory or multiple memory devices accessible via the system processor or directly by the building block modules or topology processor. The system processor provides the topology processor with source voltages and the event-driven fixed power levels for each event in the sequence and monitors current meters and voltage meters to determine a source voltage for the power source so that the load voltages satisfy under voltage specifications for all events in the sequence and monitors the current meters to adjust the interconnect design parameters to satisfy derating specifications for all events in the sequence. A computer workstation 24 is provided to allow a user to define the building blocks and topology and to monitor and interact with the machine as the topology is simulated. In a fully-automated system, the displaying of and interaction with the topology may be optional. The tool generates at least a source voltage and a robust interconnect topology that distributes power to the loads and may be configured to generate the minimum source voltage and minimum robust interconnect topology.

The system designers provide a circuit diagram of the power source, physical interconnects and loads and any applicable constraints (step 30). The power source may be specified as being a fixed-voltage source or a depleted-voltage source such as a battery. Constraints on maximum voltage, peak or total current or peak or total power may be placed on the source. Interconnects may be specified as having a current derating value. For example, in pin connectors the current derating value may be 50% of the maximum current capability. In a wire or flex harness, the current derating value is expressed as an acceptable temperature increase. For each interconnect, the system designers may provide a nominal interconnect design, a nominal interconnect design with constraints on what may be changed and to what extent (e.g. a specification or upper bound on the number of pins or a specification or constraints on the dimensions of the harness) or they may provide a fixed design. The majority of loads are typically event-driven fixed-power loads that consume a certain fixed power for a period of time defined by the event. If the event changes the fixed power may change to reflect a different operating mode or condition of the load. The system designers provide the modes of operation and fixed power levels. The loads are also specified by an operating voltage and margin that together define over and under voltage specifications. Other loads such as constant current and constant resistance may also be included. The system designers may specify a myriad of other constraints including specifics such as source and load impedance, source droop, rise times, power dissipation, noise, back EMF, inrush and peak current. The system designers may also specify that the design be optimized to reduce total power or to minimize total weight, for example.

It is to be understood that although the tool strives to provide a source voltage that satisfies all the under and over voltage specifications and an interconnect topology that satisfies all the derating conditions, if the underlying circuit provided by the system designers and any constraints thereon make that outcome impossible the tool will provide a power source and interconnect topology that satisfy the under voltage specifications and, to the extent possible, the over voltage specifications and as robust an interconnect topology as possible. A feature of the tool is that it may be configured to flag any over voltage conditions on specific loads and to flag any interconnects or portions thereof that do not satisfy derating. The tool can further provide specific information on the relevant load voltages and load currents to assist the circuit designers to reconfigure the loads or interconnects to meet specifications.

Figure 3:
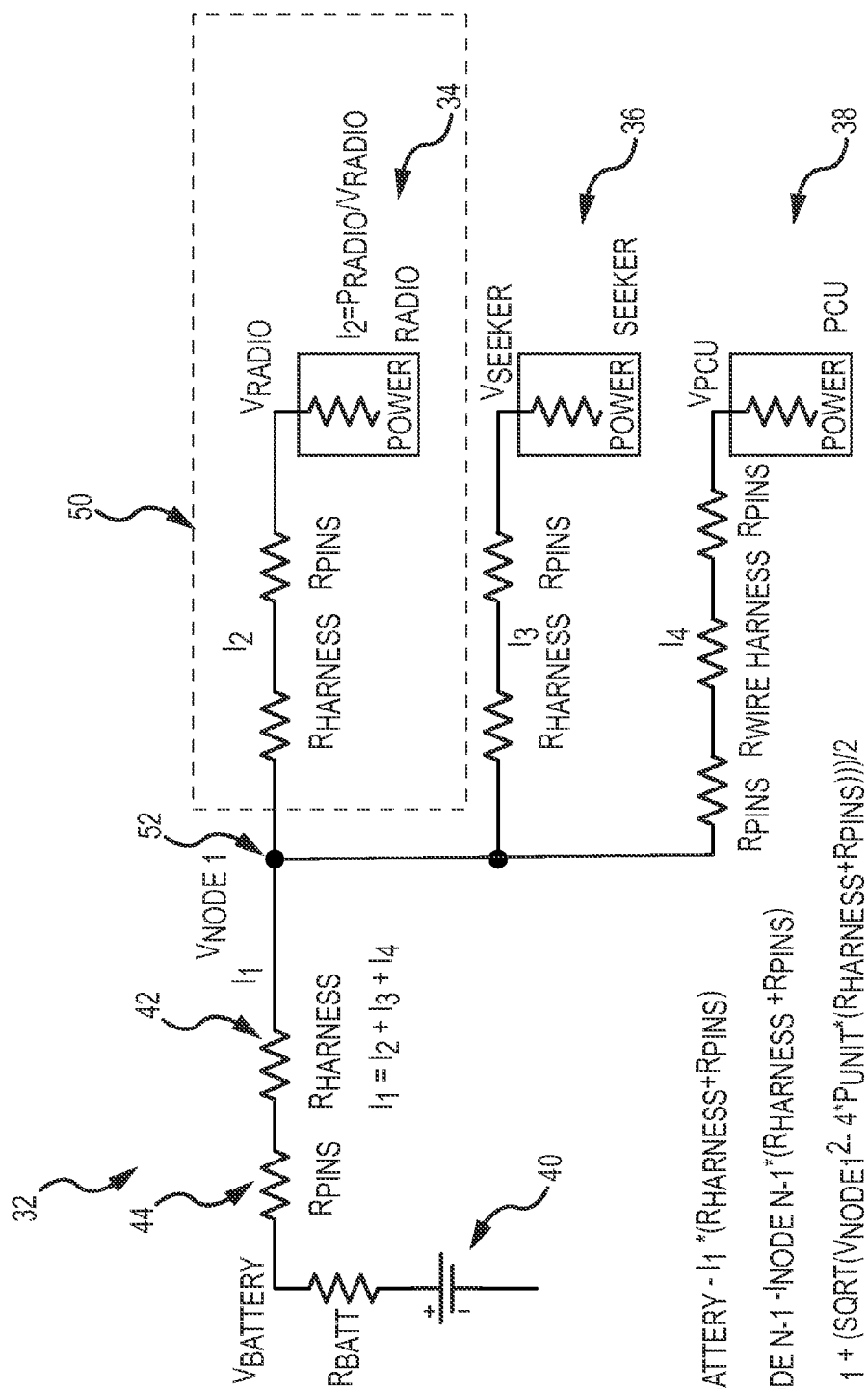
FIG. 3 is a simple circuit diagram including a power source, resistive interconnects and event-driven fixed-power loads.

For purposes of explanation, the tool will be described with reference to a simple circuit 32 shown in FIG. 3. Circuit 32 represents a portion of a missile seeker. The event-driven fixed power-loads include a radio 34, a seeker 36 and a power conditioning unit (PCU) 38 that reduces the supply voltage to other forms needed on the missile. The missile seeker timeline includes launch, fly out and end game modes each of which include one or more events. Prior to launch, the power source 40 is a fixed-voltage source on-board an aircraft that is connected to the seeker via an umbilical. After launch, the power source is a depletion-voltage battery on-board the missile. Power source 40 distributes power to the loads via physical interconnects such as wire or flex harnesses 42 and pin connectors 44.

The tool operates on a model that connects all loads to all power sources by all the physical interconnects to simultaneously calculate all load currents and load voltages. The model is formed of building blocks 50 that are arranged at nodes 52 in the topology. Our exemplary circuit includes radio, seeker and PCU building blocks that are all connected at node 1. The source interconnect building block is connected between the source and node 1.

Figure 4A:
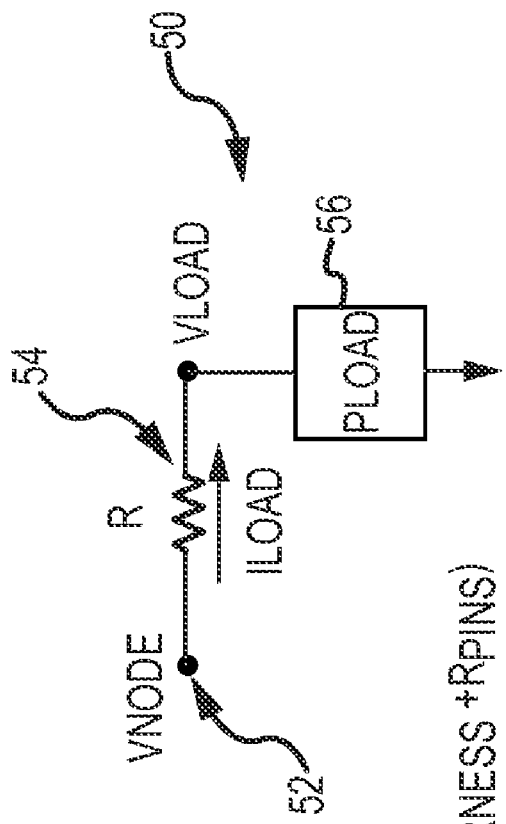
FIGS. 4a, 4b and 4c are a schematic diagram of a building block including a single event-driven fixed-power load and its one or more series-connected resistive interconnects to a node, a diagram of the radio building block module including the interconnects' current meters and the load's specification table and volt meter and a building block module template for user definition of specific blocks.

As shown in FIG. 4a, building block 50 includes one or more series-connected physical interconnects that are each reduced to a resistive equivalent 54 and a single load 56 typically event-driven fixed-power but possibly fixed-current or fixed resistance. The resistance R and for a given event Pload are known. The tool calculates Vnode (eqn. 1) from the voltage drops through the physical interconnects back to the power source. Knowing, Vnode, R and Pload, the tool calculates the load voltage Vload using a quadratic equation (eqn. 2). Similar equations exist for fixed current or fixed resistive loads. The tool calculates the load current Iload as Pload/Vload or Vnode−Vload/R (eqn. 3).

$$V\text{node}(N) = V\text{node}(N-1) - I\text{node}(N-1)*(R) \qquad (1)$$

$$V\text{load} = (V\text{node}(N) + (\text{SQRT}(V\text{node}(N)^2 - 4*P\text{load}*R)))/2 \qquad (2)$$

$$I\text{load} = P\text{load}/V\text{load} = (V\text{node}(N) - V\text{load})/R \qquad (3)$$

The tool, and more particularly topology processor 18, solves these equations iteratively for all loads in the topology simultaneously. Given a source voltage, the tool establishes small load currents to start the iteration process. The iterative process is driven to a stable solution by the loads "pulling"

current through the physical interconnects from the power source. The currents are linked from each load back to the power source with Kirchhoff's Current Law (KCL).

Figure 4B:
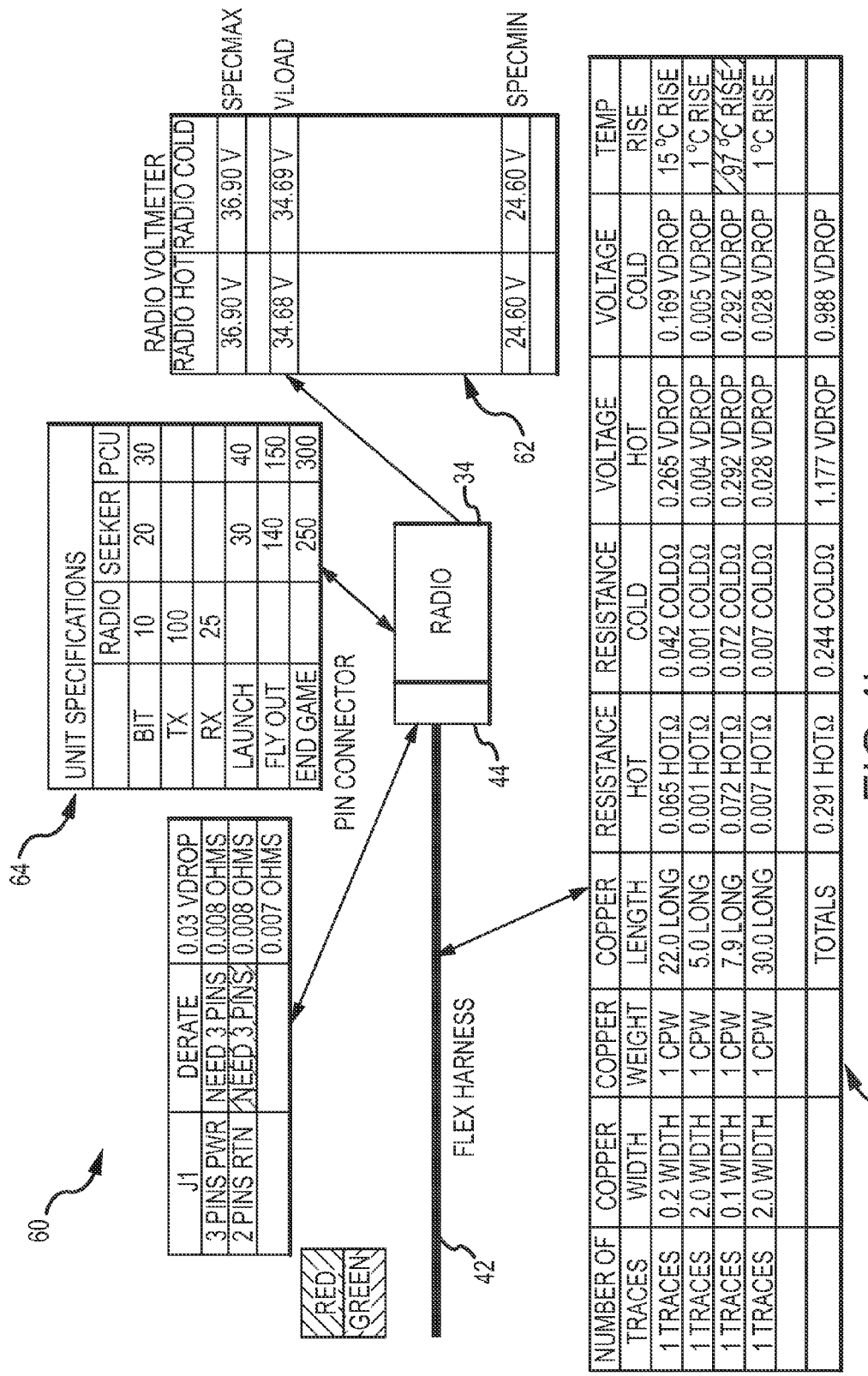

As shown in FIG. 4b, the tool implements building block modules 14 that incorporate the building block 50 equivalent circuit plus additional functionality. Each interconnect is provided with a current meter 60, each load is provided with a volt meter 62 and the block is provided with a load specifications table 64. The block may be provided with a voltage drop meter (not shown) that measures voltage drops across each interconnect. The block may also be provided with a meter (not shown) that provides the instantaneous node voltage, current and power as the timeline is executed. Building blocks may be configured for the source interconnects (no load) sans the voltmeter and specifications table.

Each current meter 60 is programmed with the design equations for the corresponding interconnect and provided with specific design parameters. The current meter calculates the resistance and a current derating value based on the values of the design parameters. The current meter provides an indicator of whether a load current exceeds the current derating value. The current meter may generate a visual indicator on the display by, for example, highlighting a cell for the interconnect with a color, typically red. The current meter may also provide an indicator of whether the interconnect current derating value is overdesigned. The current meter may generate a visual indicator on the display by, for example, highlighting the cell in a different color, typically green. Note, for purposes of illustration a "red" cell is depicted with a 45-degree cross-hatch up to the right and a "green" cell is depicted with a 45-degree cross-hatch down to the right. The current meter may be configured to calculate an adjustment of the design parameters to address the condition associated with a particular indicator. The current meter may be configured to make the adjustment automatically or require the user to "accept" the suggested change. The current meter may be configured to allow the user to override the suggested adjustment. In either case, the current makes the adjustment of the design parameters.

An exemplary current meter 60 for pin connector 44 presents the number of pins (power and return) in the left column, the resistance per pin in the right column, the total resistance in the bottom right corner, the voltage drop in the upper right and the indicator of whether the load current exceeds the current derating value in the middle column. The format of the user interface of the current meter is arbitrary. The current derating value for a pin connector is the product of the current rating per pin, the derating of each pin (e.g. 45-50%) and the number of pins. The resistance of a single pin is divided by the number of pins to give the total resistance. The design equations are internal to the current meter. The specific design parameters e.g. the number of pins, current rating per pin and required derating can be entered through the displayed user interface. If the load current exceeds the derating, the tool highlights the interconnect cell as red. If the maximum load current is less than a minimum threshold derating (e.g. 25%), the tool highlights the interconnect cell as green indicating the interconnect may be overdesigned. In this particular example, the connector includes 3 power and 2 return pins. The current meter generates an indicator (e.g. a red cell) that the design does not satisfy derating for the return pins. The current meter also calculates the adjustment (3 pins) and suggests the change. Either the change is made automatically or the user must accept (or modify) the change via the user interface. Note, if the constraints provided by the system designers do not allow for any or sufficient modifications to the interconnect, the derating indicator will be reported. The system designers have the option to provide a waver for the interconnect, allow for modifications to the interconnect or make other modifications to the circuit diagram.

An exemplary current meter 60 for flex harness 42 includes a column for the number of traces, columns for trace width, weight and length, columns for hot and cold resistance, columns for hot and cold voltage drop and the current derating value, which is by convention expressed for harnesses as a temperature rise derived from the load current and cross-section trace resistance.

$$\Delta T = (I/(0.015*A0.7349))(1/0.5453) \text{ for Internal Traces}$$

$$\Delta T = (I/(0.0647*A0.6732))(1/0.4281) \text{ for External Traces}$$

where:
I=maximum current in Amps
$\Delta T$=temperature rise above ambient in ° C.
A=cross-sectional area in square mils The dimensions of the harness may change along its length. Each row represents a portion of the harness. The format of the user interface of the current meter is arbitrary. The design equations are internal to the current meter. If $\Delta T$ exceeds a maximum threshold, the tool generates an indicator (e.g. a red cell) indicating that the derating has been exceeded. If $\Delta T$ is less than a minimum threshold, the tool generates an indicator (e.g. a green cell) indicating that the interconnected may be overdesigned. In the later case, copper may be removed from the interconnect saving weight and cost and still satisfy derating.

FLEX_TRACE_RESISTANCE $$\left[\frac{\rho \times L}{w \times t}\right] \times (1 + \text{Temp} - 20) \times \delta\rho$$

$\rho = 0.0000006787\_\text{Bulk\_RESISTIVITY\_of\_Copper}$ $L = \text{Trace\_Length\_inches}$ $w = \text{Trace\_width\_inches}$ $t = \text{trace\_thickness\_inches}$ $\text{Temp} = \text{Ambient\_flex\_Temperature\_}° \text{C.}$ $\delta\rho = 0.0039\_\text{Thermal\_coefficient\_of\_copper}$

ROUND_WIRE_RESISTANCE $$\left[\frac{4 \times \rho \times L}{\pi \times d^2}\right] \times (1 + \text{Temp} - 20) \times \delta\rho$$

$\rho = 0.0000006787\_\text{Bulk\_Resistivity\_of\_Copper}$ $L = \text{Wire\_Length\_inches}$ $\delta\rho = 0.0039\_\text{Thermal\_coefficient\_of\_copper}$ $d = \text{Wire\_diameter\_inches}$ $\text{Temp} = \text{Ambient\_flex\_Temperature\_}° \text{C.}$ The specific design parameters e.g. the number of traces and dimensions and threshold temperature rises can be entered through the displayed user interface. In this particular example, the harness includes a single trace with four separate sections. The current meter generates an indicator (e.g. red cell) that the design of the first section does not satisfy derating. Note, if the constraints provided by the system designers do not allow for any or sufficient modifications to the interconnect, the derating indicator will be reported. The system designers have the option to provide a waver for the interconnect, allow for modifications to the interconnect or make other modifications to the circuit diagram.

Each volt meter 62 provides an indicator of whether a load voltage meets an under voltage specification and an over voltage specification for the load. Each load is typically specified with a nominal operating voltage, typically both for both hot and cold operating temperatures, and a margin, which define an under voltage specification (SpecMin) and an over voltage specification (SpecMax). The user will typically enter these values into the user interface for the voltmeter. The voltmeter compares the calculated load voltage to these bounds and if warranted generates the appropriate indicator. The volt meter may generate a visual indicator on the display for the user. In this example, the calculated voltage is highlighted in one color and moves up and down between the over and under voltage specifications to provide a clear indicator of whether the load voltage is within specification. Alternately, the voltmeter could turn the calculated load voltage cell 'red' to indicate an overvoltage and 'green' to indicate an under voltage. If at the completion of the simulation, the voltmeter is still generating an indicator, that indicator will be reported back to the system designers.

Load specifications table 64 stores all the load data. In this embodiment, each row of the table represents a mode such as BIT, transmit, receive, launch, fly out or end game and each column represents a particular load such as Radio, Seeker and PCU. This data is used to set the load conditions for the different events in the sequence.

Figure 4C:
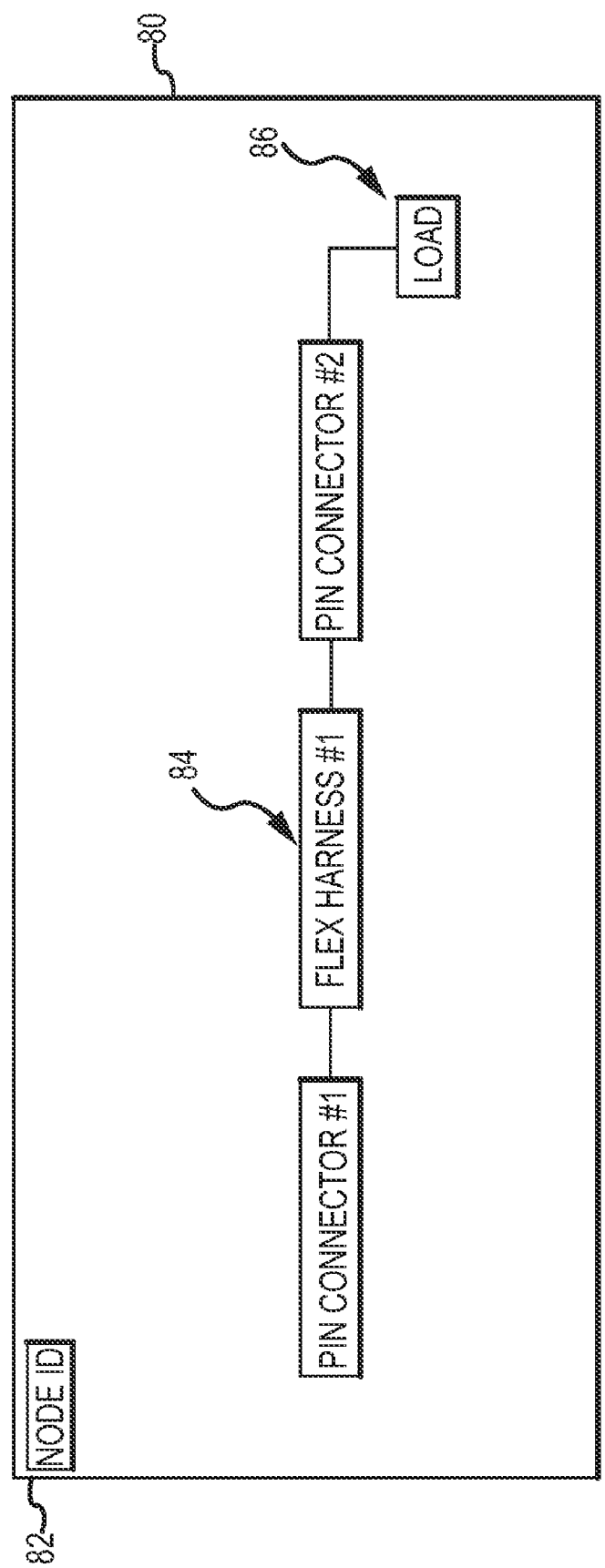

Referring back to FIG. 2, the user takes the circuit diagram and the constraints received in step 30 and defines each of the building blocks 50 (step 70) and defines the system topology by connecting the building blocks through nodes back to the power source (step 72). With reference to FIG. 4c, the user may select a building block template 80 that includes a node identifier cell 82, one or more series-connected physical interconnects icons 84 and a series-connected load 86. The user enters a node number, selects the number and type of interconnect (pin connector, flex or wire harness, etc) and the type of load (power, current or resistive). For each interconnect, the user opens the icon to access the current meter, selects the type of connector and enters the design parameters and any constraints including the current derating. The user opens the load icon, selects the type of load, and specifies the operating voltage and margin for the voltmeter and the load conditions for each event in the specifications table. The user repeats this for every building block including any without loads. Once each of the building blocks is configured, the user defines the topology of the node identifiers. In our simple circuit, the source interconnect block is connected to the source and each of the radio, seeker and PCU blocks are connected at node 1 that is connected in series with the source building block. Other approaches can be used to create the building block.

As described, the user of the tool creates the building block modules and topology from the circuit diagram and constraints provided by the systems designers of the actual hardware. Alternately, the system designers could configure the building blocks and topology and provide them in the form of input files to the tool. If the circuit diagram was specified in a certain format, an application program may be configured to create the building blocks and populate the initial design parameters.

Figure 5A:
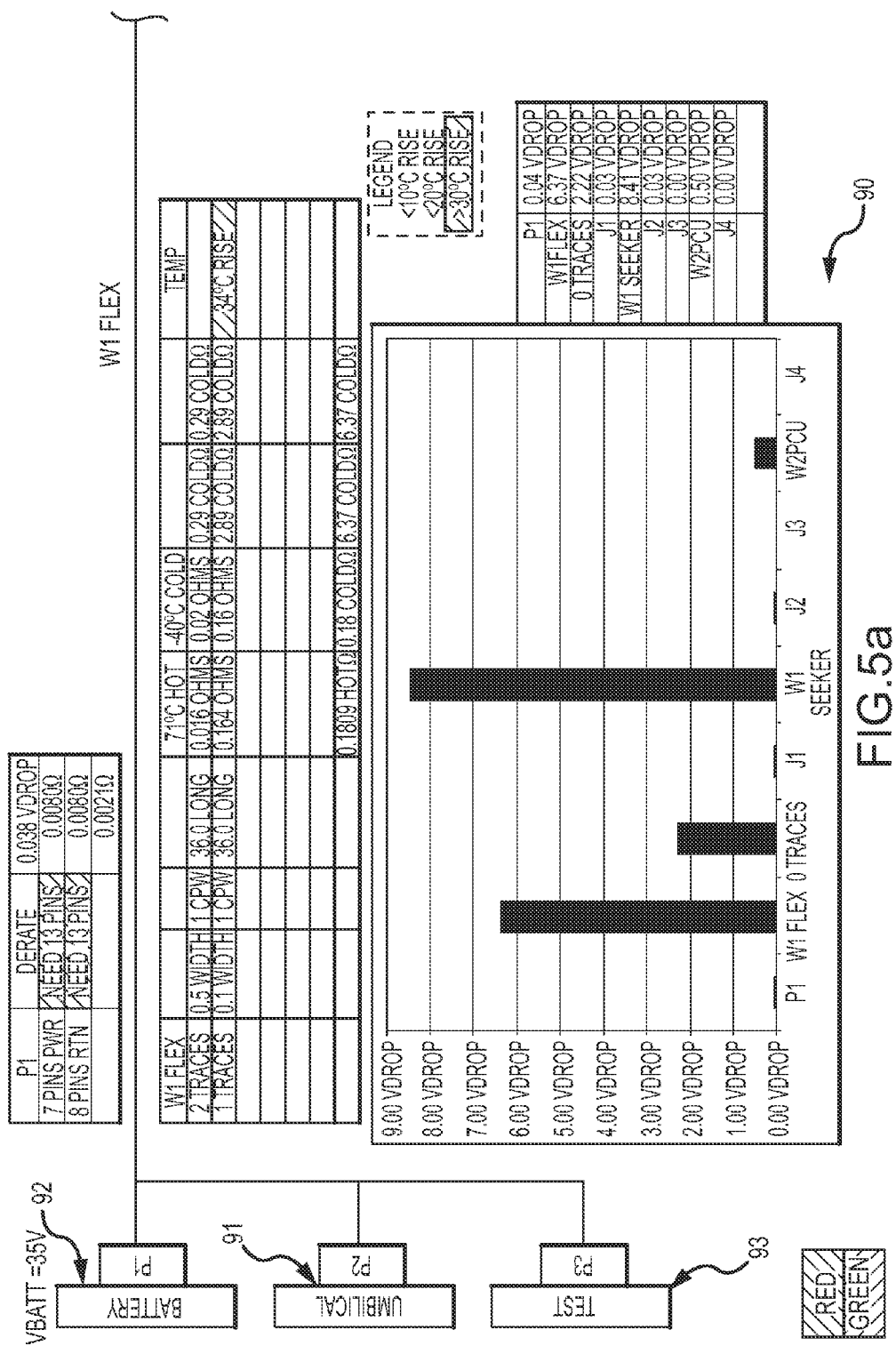
FIGS. 5a and 5b are a diagram of the topology of the building blocks that make up the simple circuit including the current and volt meters and a voltage drop graph.
Figure 5B:
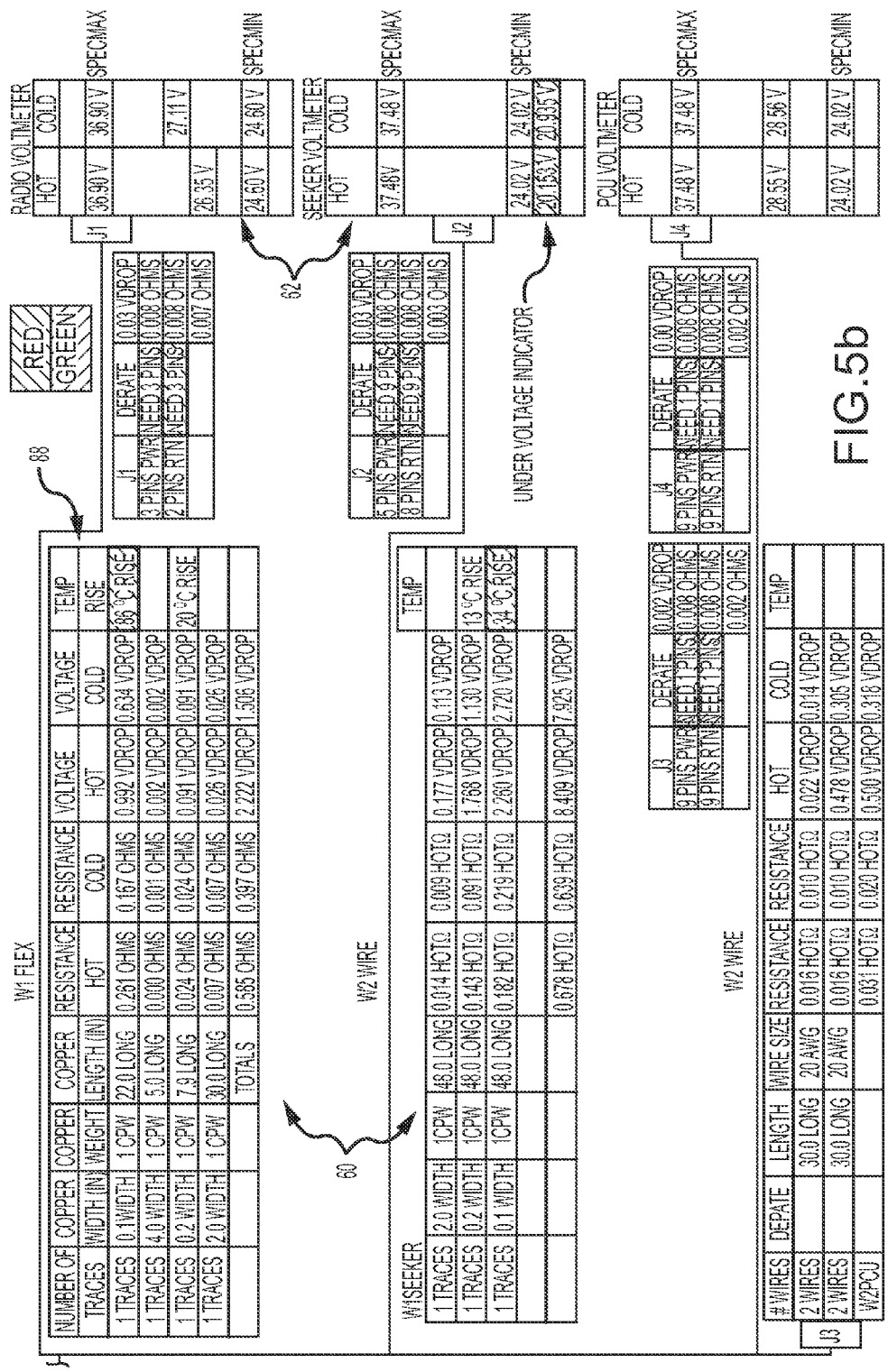

Referring now to FIGS. 5a and 5b, the tool may display the entire topology 88 (or a portion of a larger topology) including current meters 60 and volt meters 62 and a voltage drop meter 90 that provides the voltage drop across each interconnect for a given source voltage and load conditions for a particular event. In our example, there are two separate voltage sources. A fixed-voltage source on-board the aircraft is connected through an umbilical 91 via pin connector P2. A battery 92 is connected via pin connector P1. A test module 93 on the missile is connected via pin connector P3 to perform factory system testing. The fixed voltage source supplies power pre-launch and the battery provides power post-launch. The interconnect topology is designed to satisfy derating conditions for both sources. The fixed voltage source may be designed to supply a source voltage equal to the initial undepleted battery voltage.

In addition to entering and configuring the building block modules and topology, the user interfaces for the current and volt meters may allow the user to monitor the design as the simulation is performed and in some instances to provide some input or decisions. For example, the tool may 'flag' certain interconnects as having derating issues or opportunities or as having large voltage drops. The user may have the opportunity to view suggested modifications by the tool and to confirm those modifications. The user may also have the opportunity to change the modifications. In either case, the tool itself makes the adjustments internally and updates the model accordingly. Alternately, the tool may be automated to a point where the user interface (once the topology is initialized) is either displayed only to allow the user to monitor the simulation or is not displayed. The tool may be configured to find and report a robust interconnect topology and source voltage without further user involvement.

Figure 2:
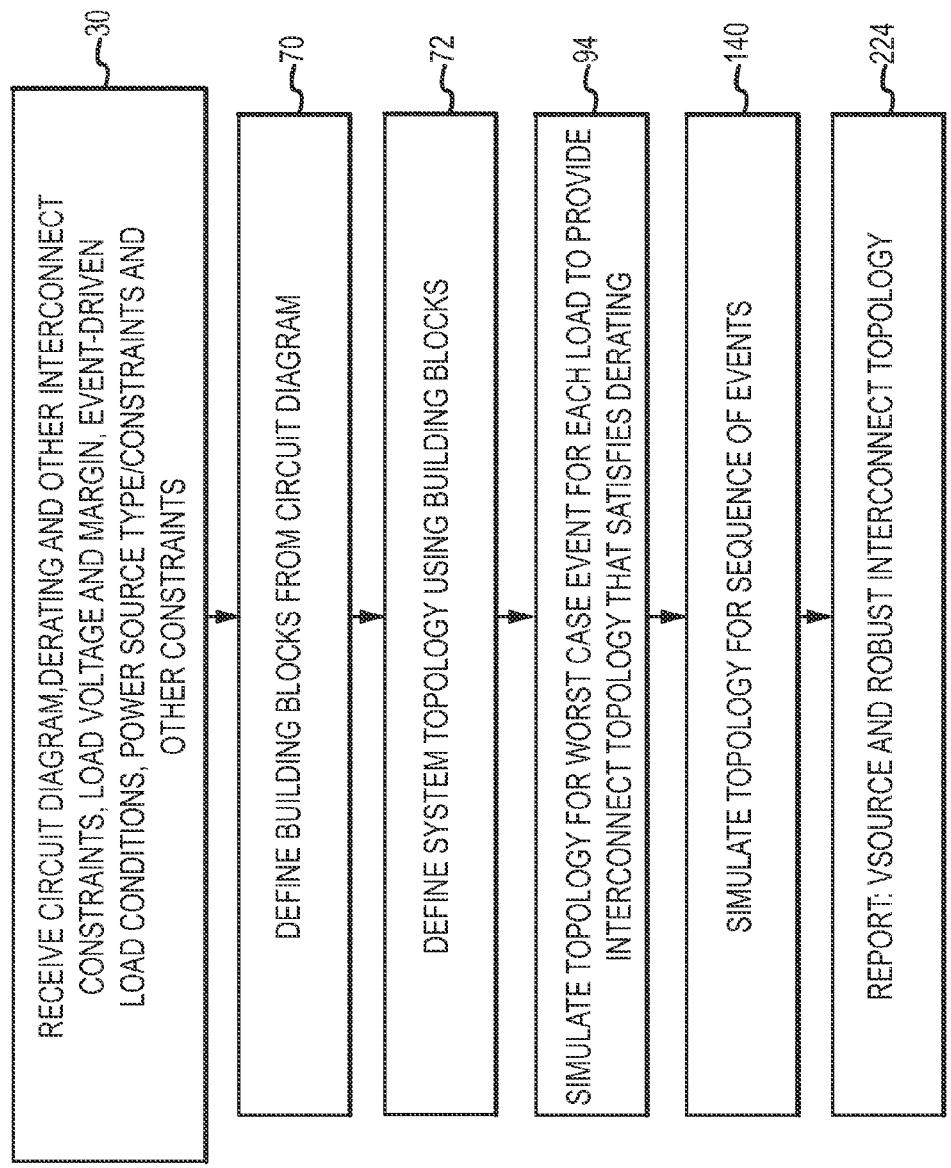

Referring now to FIG. 2, for each building block (load), the tool simulates the topology at a source voltage that satisfies the under and over voltage conditions of the loads for a worst case event for that load to stress the interconnects and provide a topology that substantially satisfies the derating conditions (step 94). Under these stressed conditions, the tool may relax interconnect designs that are overdesigned for derating. The tool may also lower the resistances of certain interconnects to reduce their voltage drops and/or increase the resistance of other interconnects to relax their design.

Figure 6:
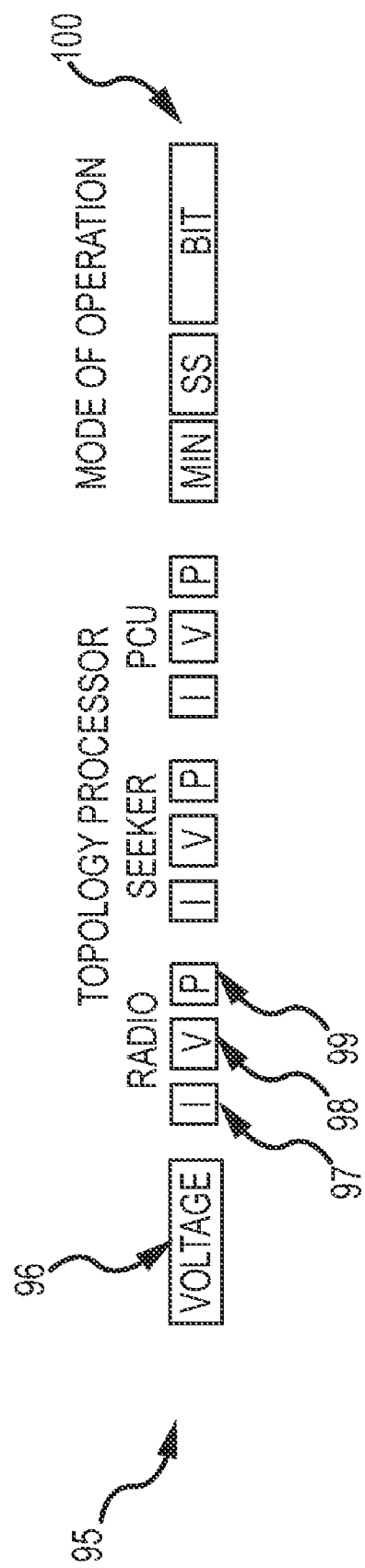
FIG. 6 is a high-level diagram of the topology for a single event.

Referring now to FIG. 6, in a particular embodiment using Excel® once the entire topology is defined, all of the voltage and current analysis equations starting from the source voltage through the interconnect topology to each of the loads may be implemented in a single row 95 of an Excel® spreadsheet. At the highest level shown in FIG. 6, the row includes the source voltage 96 for a single event, the functionality of the topology processor including current meter 97, voltage meter 98 and power meter 99 for each of the loads and the mode settings 100 that specify the load conditions (e.g. power) for the specific event. The design equations and design parameters for each of the building blocks and the topology are represented at low levels of detail in the spread sheet. The iteration feature of Excel® iterates the voltage and current equations to simultaneously solve for all of the currents and voltage for a specified source voltage and load conditions.

The tool may be configured to allow a user to drill down to these lower levels of detail to see design details and status of the simulation and possibly to accept changes recommended by the tool or to enter changes. For example, the cell for current meter 97 may be highlighted red indicating a derating or possibly volt drop issue (voltage drops may be handled separately through the voltage drop meter). The user may click on the cell to open a user interface that might have individual current meter cells for each interconnect associated with that load of which one is red. The user may then click on that red cell to open up the detailed view that shows the specific portion of the interconnect that is derated and the tool's suggestions to modify the design to correct the derating condition. The interfaces may be configured in different ways to provide the capability to "drill-down" to see and interact with the design parameters.

Figure 7:
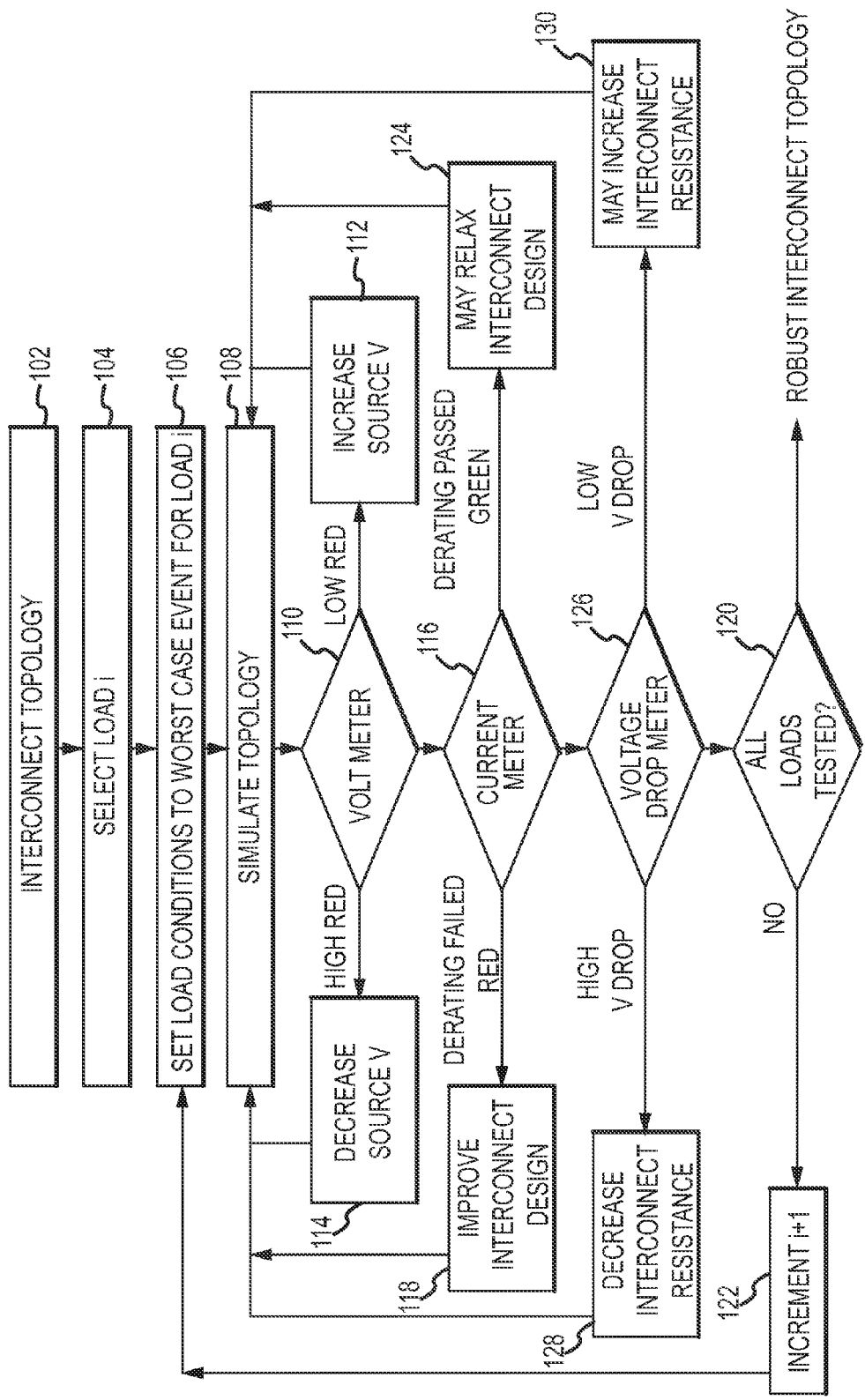
FIG. 7 is a flow diagram for establishing a baseline interconnect topology.
Figure 8B:
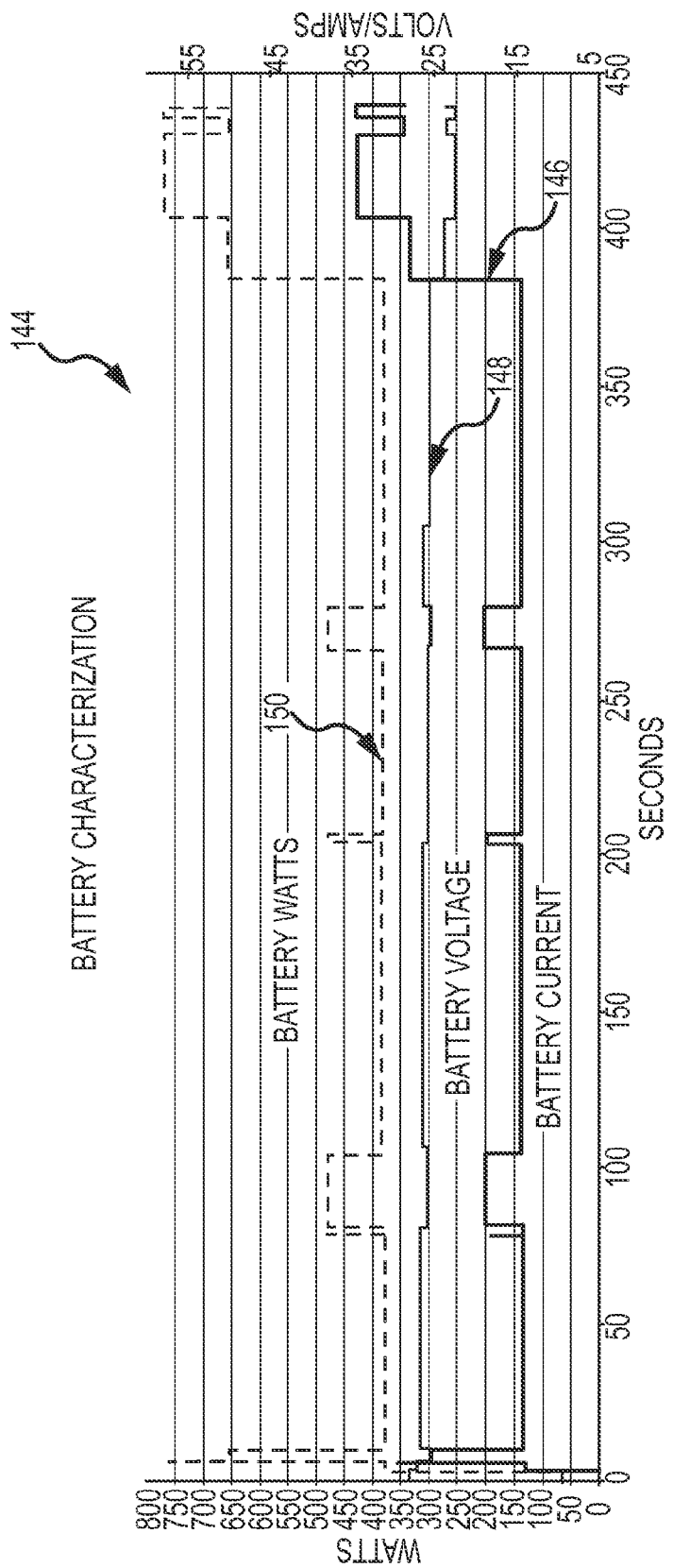
FIG. 8a is a high-level diagram of the topology for N events coupled to a battery depletion processor and 8b is a plot of battery current, voltage and power sourced over the event timeline.

Referring now to FIG. 7, the initial interconnect topology is loaded into the topology processor (step 102). The system processor selects the first building block and load i (step 104) and sets the load conditions to the worst case event for that load (step 106) and presents them to the topology processor to execute the single row 95 of the Excel® spread sheet. To a first order, the worst case event is the subset of events in which that load is set at maximum power. To a second order, the worst case event is the one event in the subset with the maximum total power. The system processor provides the topology processor with a source voltage and the topology processor simulates the topology (step 108) computing all of the load currents and load voltages. The system processor monitors the volt meters for all of the loads throughout the topology (step 110) while iterating the source voltage up (step 112) or down (step 114) to find a source voltage whereby the load voltages satisfy the under and over voltage specifications for the selected worst case event. A load voltage too high or too low may be considered to be "red" while a satisfactory load voltage may be considered to be "yellow". To apply maximum stress to interconnects, the system processor may iterate until the minimum source voltage that satisfies the specifications is found. The combination of the minimum load voltage and the maximum load power produces the maximum current, hence maximum stress on the interconnects.

At the selected source voltage, the tool monitors the current meter for each interconnect for that building block (step 116) to determine whether one or more of the interconnects fail derating. If so, the building block module calculates design parameters to improve the interconnect design to satisfy the current derating value (step 118) e.g. increase the number of pins or cross-section of the traces/wires. Assuming the system design specification allows the interconnect to be modified, the building block changes the parameters either automatically or upon acceptance by the user. Changes made to the interconnect design parameters may affect the system voltage. The system processor may repeat steps 108, 110, 112 and 114 for the updated topology to establish a new system voltage. The processor may then repeat steps 116 and 118 to retest derating under the revised conditions. The processor may be configured to iterate once or to iterate until the topology and system voltage stabilize. The system processor checks to see if all loads have been tested (step 120) and if not increments (step 122) to the next building block i+1 and repeats steps 108 through 118. At a minimum, the system processor adjusts the interconnect designs at least once to satisfy derating (if possible) for all of the building blocks.

Each interconnect may be designed at this stage so that it will not fail derating constraints under the stressful operating conditions; maximum power load and a source voltage that satisfies the over and under voltage conditions. This allows the tool in the next phase to seek a minimum source voltage to power all of the loads for all of the events. In practice, a few of the interconnects may not satisfy derating at the worst case conditions. First, unless the system processor iterates to the minimum source voltage for each load the interconnects may not be stressed with the truly maximum current. Second, earlier building blocks may be affected by modifications to later building blocks. This latter issue can be substantially remedied by executing the entire flow diagram a second time to propagate the changes. However, both issues can be remedied by monitoring the current meters during the event processing in the second phase.

The system processor may be configured to monitor and possibly adjust the design parameters to address interconnects that are overdesigned for derating. As described previously, the current meter may be configured to test the maximum load current against a minimum current derating value. If the maximum load current is less than this minimum, the interconnect derating passes "green" and the tool may relax the interconnect design (e.g. remove pins or copper from the traces or wires) (step 124). The current meter may be configured to calculate design parameters that satisfies both the green and red derating conditions. For example, the current meter may suggest removing a single pin from a pin connector. Alternately, the tool may classify any interconnect that does not fail derating at step 116 as possibly overdesigned and iteratively relax the design parameters (step 124) until the interconnect derates. At this point, the tool improves the interconnect design (step 118) by adding 1 pin or adding an incremental amount of copper or returning to the last design that satisfied derating.

The system processor may also adjust the design parameters to provide a more balanced system in terms of voltage drops across the interconnects. In general, lower resistance interconnects drop less of the source voltage and consume less power, which is desirable. However, lower resistance interconnects generally require more copper e.g. more pins or larger traces, which adds to the weight and expense of the system.

The voltage drop meter (step 126) may be configured to calculate the voltage drops of each of the interconnects for the specific building block modules under test or for all of the modules. The voltage drops may be displayed to the user. The voltage drop meter may be configured to provide an indicator of whether the voltage drop for any of the interconnects in the building block under test lie in the top X % (e.g. 10-20%) of all voltage drops and/or exceeds a threshold voltage drop or whether the total voltage drop across the one or more interconnects in the building block exceeds a threshold voltage drop allocated for a building block. For example, the voltage drop meter may be configured to provide an indicator if the interconnect Vdrop is in the top 20% or exceeds 1.5V or the total interconnect Vdrop exceeds 2V. The tool may be configured to calculate design parameters for the interconnect(s) to decrease the interconnect resistance (step 128) to satisfy the one or more criteria. The tool may require that the user to accept these suggested changes and may be configured to allow the user to modify the design parameters.

The voltage drop meter (step 128) may be configured to provide an indicator of whether the voltage drop for any of the interconnects in the building block under test lie in the bottom Y % (e.g. 10-20%) of all voltage drops and/or falls below a threshold voltage drop or whether the total voltage drop across the one or more interconnects in the building block falls below a threshold voltage drop allocated for a building block. Similar to the green derating test, this test may determine if the interconnects are overdesigned. For example, the building block under worst case conditions may draw a relatively low load current, hence the interconnects do not need to be designed with a low resistance. The tool may be configured to calculate design parameters for the interconnect(s) to increase the interconnect resistance (step 130) to satisfy the one or more criteria. The tool may allow or require the user to accept these suggested changes and may be configured to allow the user to modify the design parameters.

Changes made to the interconnect design parameters may affect the source voltage. The system processor may repeat steps 108, 110, 112 and 114 for the updated topology to establish a new source voltage. The processor may then repeat steps 116 and 118 to retest derating under the revised conditions and may repeat steps 124, 126, 128 and 130. The processor may be configured to iterate once or to iterate until the topology and system voltage stabilize. The system processor checks to see if all loads have been tested (step 120) and if not increments (step 122) to the next building block i+1 and repeats steps 108 through 118.

Changes made to the topology for subsequent building block modules may affect the source voltage, hence topology of earlier building block modules. For example, such changes could have the effect of lowering the source voltage for an earlier building block yielding a higher load current which could potentially cause an interconnect to derate "red". The system processor may be configured to repeat the entire process once or until the topology stabilizes. A single iteration should address substantially all remaining issues. Alternately, derating and voltage drop may be monitored and adjusted during simulation of the entire sequence of events.

Returning now to FIG. 2, upon completion of step 94 the tool may provide a baseline robust interconnect topology (e.g. satisfies derating) for the sequence of one or more events. There are at least three distinct cases "Single-Event", "Multiple-Event, Fixed Source Voltage" and "Multiple-Event, Depletion Source Voltage" that affect how the tool may be configured and used from this point. In general, the tool may be configured to simulate the baseline topology for the entire sequence of events to select the source voltage and possible refine the baseline topology to the final robust and potentially minimum robust topology (step 140)

For a Single-Event case, step 94 also provides a robust source voltage (e.g. satisfies under and over voltage conditions). As described above, the tool in executing step 94 may be configured to provide the minimum robust source voltage and/or the minimum robust interconnect topology (e.g. address the "green" conditions in flow diagram FIG. 6). For the Single-Event case, the execution of step 140 is akin to the final iteration of the flow diagram in FIG. 6 and thus may be optional.

For a Multiple-Event, Fixed Source Voltage case, step 94 may also provide a robust source voltage. The tool may be configured to select the maximum of the source voltages selected for each of the building block modules. If the minimum source voltages were selected for each building block, the maximum source voltage should represent the minimum actual source voltage that will satisfy each of the multiple events. For the Multiple-Event, Fixed Source Voltage case, the simulation of the sequence of events is again optional as the robust source voltage may be provided by storing and then selecting the maximum source voltage. However, simulation of the sequence of events may, in the event the source voltages for the individual building blocks were not minimized, provide the minimum source voltage and/or provide a minimum robust interconnect topology. As described with reference to FIG. 7, the tool may optimize the topology by addressing "green" opportunities for derating or voltage drop. However, that optimization is performed under worst case conditions. Because the source voltage (maximum of the block source voltages) is higher for typically all but one building block, the actual load currents will be lower. This may present additional opportunities for the tool to identify and adjust the topology. This may also flag any overvoltage conditions that may remain.

For a Multiple-Event, Depletion Source Voltage case, step 94 may provide a robust interconnect topology for a worst case static event and source voltage but does not directly provide an initial source voltage that as it is depleted over time with the execution of the individual events sources power to all the loads to satisfy their under and over voltage conditions and not to derate any of the interconnects. A typical case would be to simulate the topology over the multiple events to specify the voltage and amp-seconds of a battery. The battery voltage is typically specified as the number of "cells" of the battery. For example, each cell may be 1.9V so the simulation specifies the number of cells that satisfy the required source voltage. For reasons of weight, power consumption and cost it is often desirable to specify the minimum battery voltage and minimum amp-seconds required to execute the sequence of events. A tolerance to ensure successful completion of the mission may be built directly into these minimums or into the specifications on the loads and interconnects. The tool could be configured to set the source voltage by adding a margin to the maximum of the source voltages selected for each building block where the margin is an estimate of the depletion of the source voltage over the sequence of events. However, this margin is at best imprecise and does not provide total amp-seconds the battery must source.

For the Multiple-Event, Depletion Source Voltage case, the simulation of the sequence of events is useful to determine a source voltage (or a minimum source voltage) that satisfies the under and voltage conditions over the entire sequence of events and to determine the total amp seconds required to source the load requirements. The tool iterates a source voltage while simulating the entire sequence of events to find a source voltage (or the minimum source voltage) that satisfies the under and over voltage conditions throughout the timeline of the events. The tool may also be configured to flag and correct any residual interconnects that might derate "red" and may also be configured to flag and address any interconnect that might be "green" to provide a minimal robust design.

Referring now to FIGS. 8-14, an exemplary embodiment for executing step 140 for a Multiple-Event, Depletion Source Voltage case is illustrated. As shown in FIG. 8a, the single row 95 is copied in the spread sheet as many times as there are events in the time line. Changes made to the topology in any row are updated in all rows. The fixed source voltage is replaced with a battery depletion model 142 so that the source voltage (Battery Vout) is depleted as each event is accomplished and the depleted voltage is input to the next row to execute the next event. The battery depletion module may also track the current supplied and time of each event in order to integrate the total amp-seconds required of the battery. As shown in FIG. 8b, the system processor may be configured to generate and display a battery characterization plot 144 including the instantaneous battery current 146, battery voltage 148 or battery power 150 over the timeline of the execution of the events. With reference back to FIG. 1, the tool may be configured so that the system processor 22 controls mode module 16 to set the load conditions in each row for the specific event, controls the battery depletion processor 20 to execute the battery depletion module to generate the source voltage in each row for the specific event and controls the topology processor 18 to then execute the row to compute all the load voltages and currents, which in turn cause the current and voltmeters to generate indicators.

Referring now to FIGS. 9a and 9b, the battery depletion model 142 and table 152 simulated by battery depletion processor 20 describes the behavior of a battery supplying a current to a number of topology processors that are each assigned a time interval and a load profile (e.g. an event). This time interval ($\partial t$) is an interval over which the load current is constant. The Battery Depletion model uses a Capacitor to model the battery amp-seconds capacity and a Resistive formula to calculate the instantaneous internal battery resistance. The battery depletes as current is drawn by the load profiles determined by the mission timeline. Table 152 describes the different functional blocks and parameters of the model. Some parameters can be changed to accommodate different battery types or can be calibrated to an actual battery type by matching the parameters to the battery data. If actual data is available then the depletion model is set to the same load profile as the data. The capacitor value and the battery resistance values are then altered to match the measured voltage output waveform. This calibrates the depletion model to measured data. Otherwise, the starting values for the capacitance is automatically set as the same magnitude as the system amp-sec. The amp-sec value provides a good starting point for capacitor farads if one is not known. The exact value of the capacitor will be added in when a battery type is determined. This value of capacitance will not adversely affect the model performance, it enables the depletion model to handle the required amp seconds of the design time line. When the actual battery chemistry type is decided on the parameters will be run again in the depletion model to ensure the minimum robust battery design results. The value of the capacitance will be determined by the maximum voltage droop on the battery bus allowed by the system requirements. This is shown in the output voltage wave form. A very small droop specification means a large capacitance and a more expensive and heavier battery. An indicator is added to the battery depletion model voltage (battery Voltage) to allow the battery voltage cell to turn red if the droop is exceeded from one time step to next. Yellow cell will indicate that the droop is above 90% of the specification, and green will indicate it is 5% of the battery droop specification. This battery voltage droop is agreed upon by all the system unit engineers and is set for the system design. A 2 volt battery droop is common and is used in the battery depletion model until changed by system requirements.

The model starts with the battery at its fully charged state which is shown as V open circuit ($V_{oc}$). Current is pulled from the battery by the load causing the capacitor to loose some charge and thus reducing $V_{cap}=I_N*\partial t/C$. The battery slope is multiplied by the $V_{cap}$ to allow for those batteries that change discharge slope with time. The loads pull current from the battery causing a voltage drop across the internal battery resistance. This reduces the $V_{oc}$ value. The battery resistance has a starting value and a time dependent value. This value is found on battery data sheets for the particular battery family chosen. Typical starting value is found in the table. The actual values will be substituted when the battery type is selected. The model will be re run to ensure the battery voltage will be the minimum robust battery $V_{Rbatt}=I_N*(\partial R_{batt}/\partial t\ R_{batt\_0})$. Both $V_{cap}$ and $V_{Rbatt}$ as negative inputs to the last summing junction. They subtract from the battery voltage as the timeline is supplying the loads with amp seconds of energy so that $V_{batt}=V_{oc}-V_{cap}-V_{Rbatt}$. This model is run for each topology processor and its results form the input to the next topology processor. This model is rerun for each change to the circuit or any parameters to insure the most current design is modeled.

Figure 10:
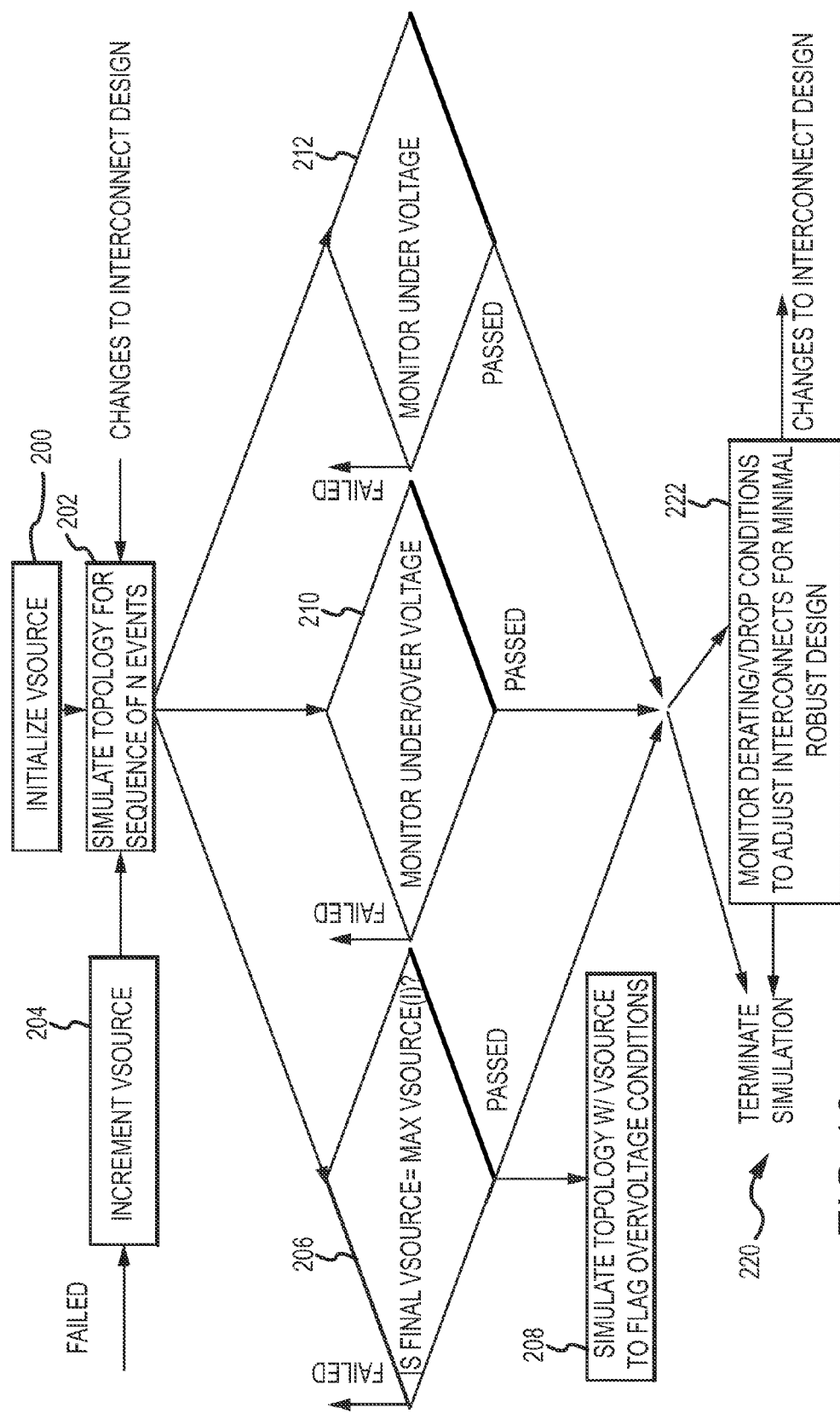
FIG. 10 is a flow diagram for simulating the topology for the N events.

Referring now to FIG. 10, the system processor simulates all of the events in the sequence iteratively to select the source voltage that satisfies the under and over voltage specifications. The system processor sets an initial source voltage Vsource (step 200). The processor may select an arbitrary starting point and iterate until a solution is found. The processor may be configured to add a margin the maximum of the source voltages found during the execution of step 94 to initialize the source voltage. The system processor presents the initial source voltage and load conditions for the first event to the topology processor to simulate the first event, presents the current and time period to the battery depletion processor to update the source voltage and presents that source voltage and load conditions for the second event to the topology processor and so forth until the entire sequence is complete (step 202). The source voltage is incremented (up or down) (step 204) and process is repeated until a source voltage is found that satisfies the voltage specifications.

The system processor may be configured to implement any one of at least three different approaches to terminate the process. In a first approach, the system processor is configured to iterate the simulation until the final depleted source voltage is equal to (or slightly greater than) the maximum of the source voltages set during the execution of step 94 (step 206). This ensures that at least that voltage is presented to the topology processor at each event. In this configuration, the individual volt meters are not used. To flag any residual over voltage conditions, the final topology may be simulated with the final source voltage (step 208). In a second approach, the system processor is configured to monitor the individual load volt meters as the events are processed and the source voltage is iterated to identify a source voltage that satisfies the under and over voltage specifications (step 210). A source voltage that satisfies all the under voltage specifications and the most over voltage specifications will be acceptable. The source processor flags any loads with over voltage condition. The original system specification or individual load specifications may simply not allow for a source voltage that satisfies all conditions. In a third approach, the system processor is configured to monitor the individual load volt meters as the events are processed and the source voltage is iterated to identify the minimum source voltage that satisfies the under and over voltage specifications (step 212). The processor starts with a high initial source voltage and reduces it until a first volt meter produces an under voltage indicator or starts low and increases the voltage until all the under voltage indicators are turned off.

Figure 11:
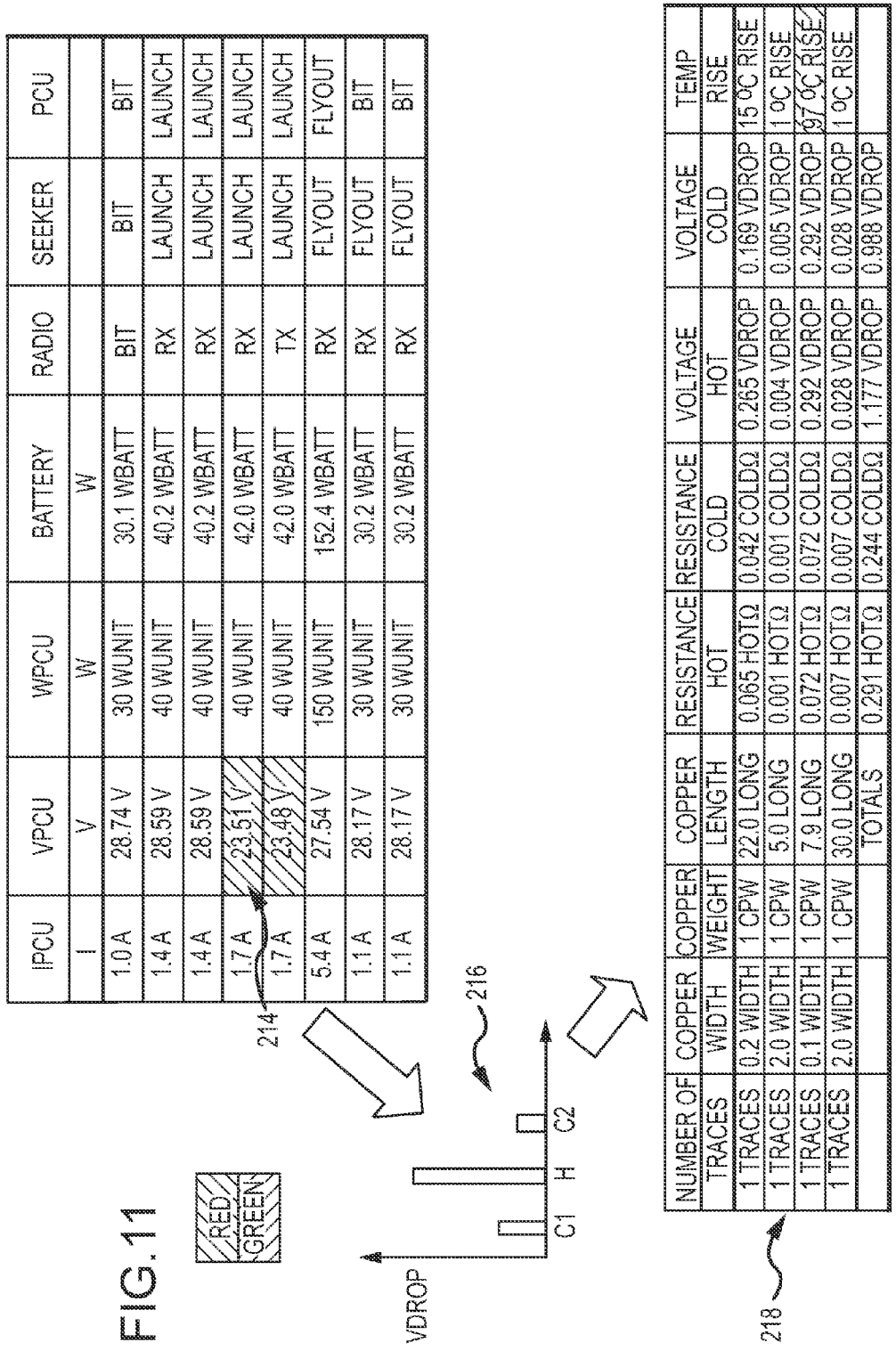
FIG. 11 is a diagram of the topology illustrating an under voltage indicator for the PCU, a voltage drop graph for the PCU building block and drop down window that displays the current meter for the interconnect with the highest voltage drop.

Referring now to FIG. 11, for either the second or third approaches, if the system processor detects an under voltage indicator 214 it may increase the source voltage or it may be configured to assess the voltage drops 216 across the interconnects for the corresponding load and, if one or more of the voltage drops is high, adjust the design parameters 218 to reduce the voltage drop. Reducing the voltage drop will have the effect of increasing the load voltage and may turn the under voltage indicator 214 off. This may be particularly useful if the system processor is not programmed to perform the voltage drop analysis and adjustments during step 94.

Once the source voltage is selected, the system processor may terminate the simulation immediately (step 220) or, at the selected source voltage, monitor the derating indicators or voltage drops to adjust the design parameters (step 222) and repeat the simulation (step 202) until both the source voltage and interconnect topology stabilize and then terminate the simulation (step 220). The system processor reports the source voltage Vsource (and total amp seconds) and the robust interconnect topology (step 224) as shown back in FIGS. 1 and 2. The system processor may also report any loads that over voltage during the final simulation or any interconnects that derate. These conditions should not occur if the original circuit diagram is properly designed but in large enough circuits problems can occur. The ability of the system processor to flag these problems is a useful feature. The processor can also provide details to assist the designer to reconfigure the load or interconnect. For example, the processor could identify during which event(s) the interconnect derates and by how much.

The decision whether to terminate immediately (step 220) or to iterate the topology (step 222) and source voltage may be determined at least in part by whether the baseline topology (FIG. 7) truly ensures that all derating conditions are satisfied and the extent to which the baseline topology was optimized (e.g. voltage drops and opportunities to relax the design parameters) and in part by whether the system designers have request "a" robust design or "the minimal" robust design. If the flow diagram was not iterated to ensure that all red derating conditions were satisfied, immediately terminating at this point may present a risk that the final interconnect topology may include one or more interconnects that might derate when the source voltage is applied and depletes over the execution of the events. If the large voltage drops or opportunities to relax the interconnects design parameters were not addressed, the interconnect topology although robust may not be minimal or well balanced. Even if the system process is configured to ensure that all derating conditions are satisfied and to minimize the topology in FIG. 7 the minimization occurs under "worst case" conditions. Once the actual source voltage is selected, particularly with a depletion voltage source, the actual conditions may be less stressful on the interconnects (e.g. lower current), and thus provide additional opportunities to relax the design of selected interconnects (e.g. fewer pins or smaller traces). The system process may be preferably configured to optimize the topology during both the design of the baseline topology (FIG. 7) and the simulation of the sequence of events to determine the source voltage (FIG. 10). Optimizing the baseline topology may greatly reduce the incidence of derating indicators and opportunities to relax the design during the event simulation and may reduce the number of iterations required to find a stable source voltage and topology.

Referring now to FIG. 12, during the simulation of the sequence of events the load current in the PCU building block module has exceeded the current derating value for one or more of the interconnects. The system processor has generated an indictor 250 by, for example, highlighting the cell red. The system processor may be configured to automatically drill-down to ascertain that the flex harness 252 is derating and particularly the first trace section 254 of the flex harness, calculate and make the required changes to the design parameters. Alternately, the system processor may be configured such that if a user selects the red cell, a more detailed user interface 256 is displayed that highlights the flex harness 252. If the user selects the flex harness, the processor displays the design parameters in an even more detailed user interface 258. The system processor displays the derating indicator and suggests the modifications to the trace to solve the problem and upon user confirmation (e.g. clicking the cell with the changes), incorporates the design changes.

Figure 13:
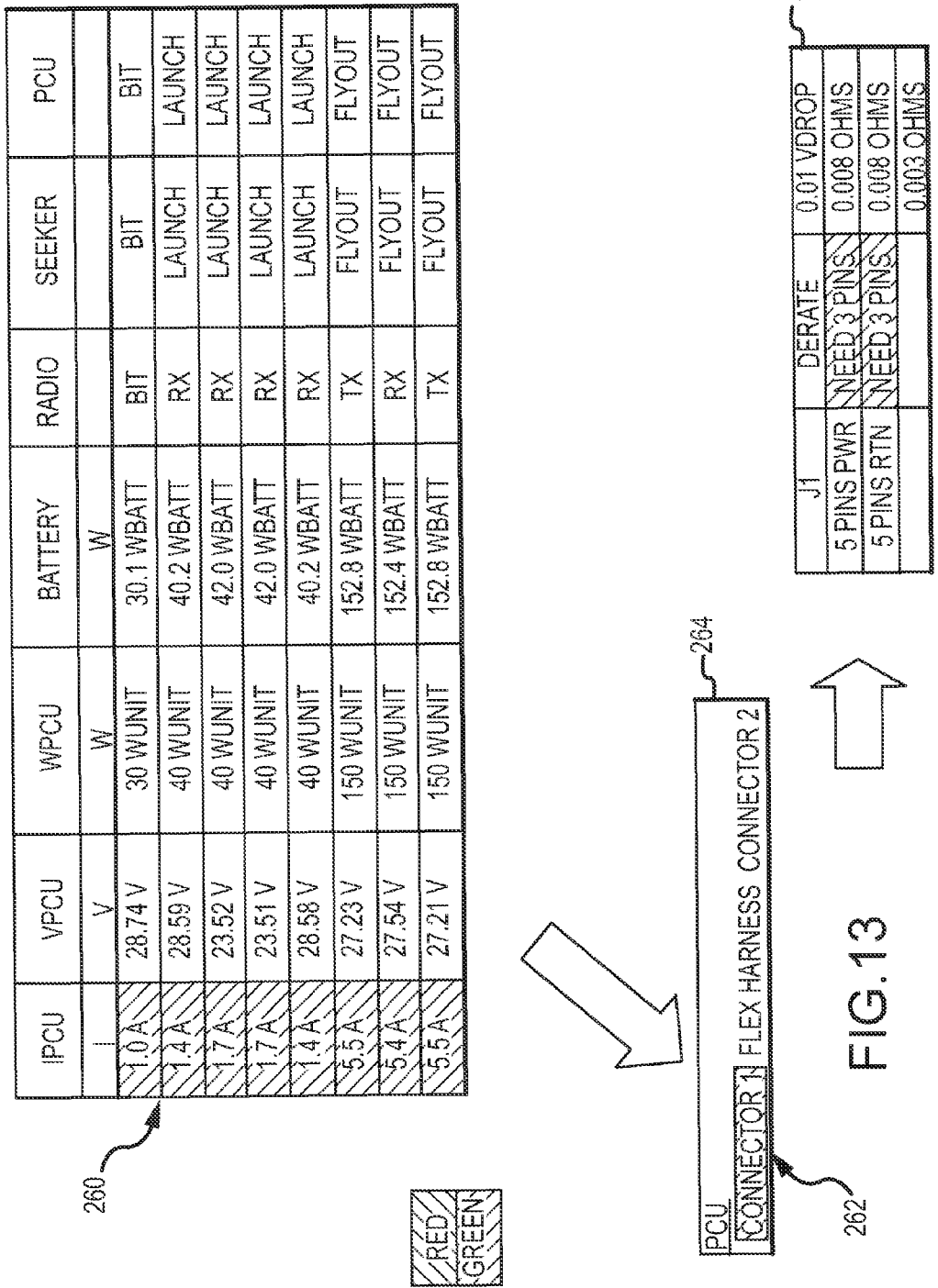
FIG. 13 is diagram illustrating an embodiment for identifying overdesigned interconnects for the PCU including drop down windows that identify the particular interconnect and suggest a minimal robust design that satisfies derating.

Referring now to FIG. 13, during the simulation of the sequence of events the load current in the PCU building block module is low enough that it is below the minimal current derating value for one of the interconnects for all of the events. The system processor has generator an indicator 260 by, for example, highlighting the cell green across all of the events. The system processor may be configured to automatically drill-down to ascertain that connector 1 262 is overdesigned (e.g. designed with 5 pins and only requires 3 pins to satisfy derating), calculate and make the required changes to the design parameters. Alternately, the system processor may be configured such that if a user selects the green cell, a more detailed user interface 264 is displayed that highlights connector 1 262. If the user selects connector 1, the processor displays the design parameters in an even more detailed user interface 266. The system processor displays the derating indicator and suggests the modifications to the number of pins to solve the problem and upon user confirmation (e.g. clicking the cell with the changes), incorporates the design changes.

Figure 14:
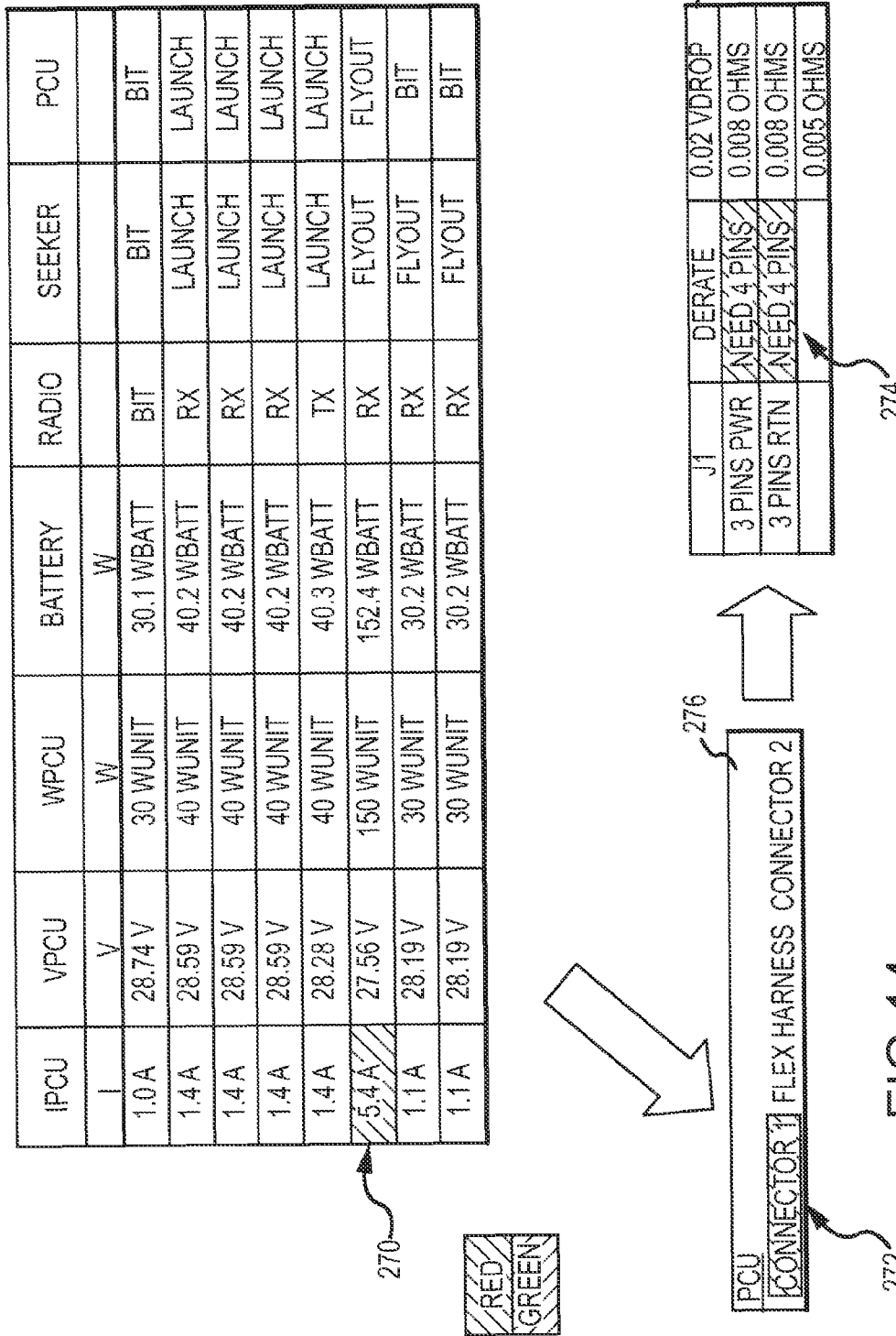
FIG. 14 is a diagram illustrating another embodiment for identifying overdesigned interconnects to provide a minimal robust design.

Referring now to FIG. 14, once the system processor has addressed any "red" derating or voltage drop conditions and established the source voltage it may be configured to iteratively relax the design parameters to find the minimal topology that satisfies derating. This approach only requires that the interconnects either pass or fail derating. The system processor may relax each (or selected) interconnects by one increment (e.g. one pin or a defined thickness or width of a trace) and rerun the simulation over all events. If any of the interconnects derate, the system processor highlights the current cell 270 of the corresponding load red. The system processor can drill down to identify the interconnect that derated (e.g. connector 1 272) and return it to its prior design parameters (e.g. 4 pins 274) that satisfied derating. As each interconnect derates and is fixed, the system processor tags that interconnect so that it is not relaxed any further. Once all of the "red" interconnects are fixed and tagged, the system processor may relax all the remaining interconnects by another increment and so forth. The system processor may be configured such that if a user selects the red cell, a more detailed user interface 276 is displayed that highlights connector 1. If the user selects connector 1, the processor displays the design parameters in a more detailed user interface 278.

The user interfaces and scenarios depicted in FIG. 11 through 14 are merely exemplary to illustrate the capabilities of the power distribution tool. The tool may be configured to drill down into and represent the information in many different ways to monitor the individual voltage and current meters and to adjust the design parameters to achieve the goals of a robust interconnect topology and a robust source voltage and possibly a minimum robust interconnect topology and minimum robust source voltage.

The machine comprised of one or more computing devices (e.g. memory and computer processors) configured to implement a systems power distribution tool performs certain core functions. Within a building block, the machine calculates the resistance of each interconnect and current derating value for each interconnect, determines whether a load current exceeds the current derating value and determines whether a load voltage satisfies the under voltage and over voltage specifications. The topology processor calculates all load currents and voltages for the entire topology simultaneously. The topology processor may also compute voltage drops across the interconnects, identify the largest drops and suggests modifications to the interconnects to reduce their resistance. The system processor selects a worst case event for each load, iterates to find Vsource for the worst case event for each load, suggests changes to interconnects to address red/green derating conditions, and determines the actual source voltage to satisfy all events in the sequence. User involvement is generally limited to establishing the initial topology provided to the machine tool. After that, no additional user involvement may be required. The user may be asked to "confirm" design changes and may be given the opportunity to modify or override design changes. The user may evaluate the voltage drops to identify candidate interconnects for redesign and then either confirm design changes calculated by the tool or specify the design changes. The system processor may be configured to display user interfaces to allow the user to follow the simulation as it proceeds.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A computing device for simulating power distribution from a power source in an electrical system over a sequence of one or more events, comprising:
   a plurality of building block modules implemented on a first computing device, each said module including an interconnect resistance for one or more series-connected physical interconnects and one or more event-driven fixed power levels for a single load, a current meter for each said physical interconnect that calculates a current derating value from design parameters and provides an indicator of whether a load current exceeds the current derating value and a volt meter that provides an indicator of whether a load voltage meets an under voltage specification and an over voltage specification for the load;
   a topology processor that interconnects a power source model with the plurality of building blocks at nodes into an electrical topology for the electrical system, said processor applying a source voltage to said topology and calculating load voltages and load currents pulled from the power source to the nodes for a single event; and
   a system processor that provides the topology processor with source voltages and the event-driven fixed power levels for each said event in the sequence and monitors the current meters and voltage meters to determine a source voltage for the power source so that the load voltages satisfy the under voltage specifications for all events in the sequence and monitors the current meters to adjust the interconnect design parameters so that the load currents do not exceed the current derating values for all events in the sequence.

2. The computing device of claim 1, further comprising:
   a display, wherein said current meters displays the design parameters of the interconnects and the indicator of whether the load current exceeds the current derating value on said display, and wherein the voltmeter displays the indicator of whether the load voltage meets the under and over voltage specifications on said display.

3. The computing device of claim 2, wherein the displayed indicators are colors.

4. The computing device of claim 2, wherein the system processor calculates adjustments to the interconnect design parameters to satisfy the current derating values and displays the adjustments on the display.

5. The computing device of claim 1, further comprising a voltage drop meter implemented on a second computing device that calculates voltage drops across the interconnects, said system processor adjusting interconnect design parameters to reduce at least one said voltage.

6. The computing device of claim 5, further comprising a display, wherein said system processor displaying a voltage drop chart of the voltage drops on the display and wherein said current meters display the design parameters of the interconnects.

7. The computing device of claim 6, wherein said system processor identifies one or more relatively large voltage drops and calculates adjusted design parameters that are displayed to the user to accept or reject.

8. The computing device of claim 1, wherein said current meters provide a second indicator of whether load current is less than a minimum current derating value, said system processor adjusting the interconnect design parameters so that the load current falls between the minimum current derating value and the current derating value.

9. The computing device of claim 1, further comprising an Excel® application program implemented on the topology processor, wherein said electrical topology for a single event is implemented in a single row of the Excel® spread sheet, said single event copied into a subsequent row for each said event in the sequence.

10. The computing device of claim 9, wherein the topology processor uses an iteration feature of Excel® to iteratively calculate the load voltages and load currents for all loads simultaneously for the event.

11. The computing device of claim 1, wherein the system processor (a) for each building block in the topology, presents a worst case event for that load to the topology processor and monitors the volt meter while iterating the source voltage to find a source voltage whereby the load voltages satisfy the under and over voltage specifications for the selected worst case event, and at that source voltage monitors the current meter for each said interconnect for that building block and if the load current exceeds one or more of the current derating values adjusts the design parameters of the corresponding one or more interconnects to satisfy the respective current derating values and (b) determines the source voltage for the power source that satisfies the under and over voltage specification for all one or more events in the sequence.

12. The computing device of claim 11, wherein the system processor selects the worst case event for each said load as an event in which the fixed power level for the load is at a maximum.

13. The computing device of claim 12, wherein the system processor selects worst case event as the event in which the fixed power level for the load is at a maximum and the total power level for the other said loads is maximum.

14. The computing device of claim 11, wherein the system processor in (a) also calculates voltage drops across the interconnects and adjusts the design parameters for at least one interconnect to reduce the voltage drop.

15. The computing device of claim 11, wherein said current meters provide a second indicator of whether load current is less than a minimum current derating value, said system processor in (a) monitors the second indicator and adjusts the interconnect design parameters for at least one interconnect so that the load current falls between the minimum current derating value and the current derating value.

16. The computing device of claim 11, wherein the sequence includes a single event, said system processor selecting the iterated source voltage as the source voltage.

17. The computing device of claim 11, wherein the sequence includes a plurality of events and said power source model provides a fixed voltage, said system processor selecting the maximum of the source voltages for the multiple building blocks as the source voltage.

18. The computing device of claim 11, wherein the sequence includes a plurality of events and said power source model comprises a battery depletion model that provides a source voltage that depletes with time as the sequence of events is performed, further comprising:
   a battery depletion processor that simulates a drop in source voltage for a single event,
   wherein said system processor connects the battery depletion processor and topology processor to execute the sequence of events and monitors the voltage meters to iteratively determine the source voltage that satisfies the under and over voltage specifications for all events in the sequence.

19. The computing device of claim 18, wherein the battery depletion processor simulates the amp seconds used during the single event, said system processor providing the total amp seconds for the battery.

20. The computing device of claim 18, wherein the system processor iteratively determines the minimum source voltage that satisfies the under and over voltage specifications for all events in the sequence.

21. The computing device of claim 11, wherein the system processor in (b) also calculates voltage drops across the interconnects and adjusts the design parameters for at least one interconnect to reduce the voltage drop.

22. The computing device of claim 11, wherein said current meters provide a second indicator of whether load current is less than a minimum current derating value, said system processor in (b) monitors the second indicator and adjusts the interconnect design parameters for at least one interconnect so that the load current falls between the minimum current derating value and the current derating value.

23. A computing device for simulating power distribution from a power source in an electrical system over a sequence of multiple events, comprising:
   a display;
   a plurality of building block modules implemented on a first computing device, each said module including an interconnect resistance for one or more series-connected physical interconnects and one or more event-driven fixed power levels for a single load, a current meter for each said physical interconnect that displays the design parameters of the interconnects, calculates high and low current derating values from the design parameters and displays a visual indicator of whether load current exceeds the high current derating value or is less than the low current derating value and a volt meter that displays a visual indicator of whether a load voltage meets an under voltage specification and an over voltage specification for the load;
   a topology processor that interconnects a power source model with the plurality of building blocks at nodes into an electrical topology for the electrical system and displays at least a portion of the topology on the display, said processor applying a source voltage to said topology and calculating load voltages and load currents pulled from the power source to the nodes for a single event; and
   a system processor that provides the topology processor with source voltages and the event-driven fixed power levels for each said event in the sequence and monitors the current meters and voltage meters to determine a source voltage for the power source so that the load voltages satisfy the under voltage specifications for all events in the sequence, monitors the current meters to adjust the interconnect design parameters so that the load currents are between the low and high current derating values for all events in the sequence and monitors voltage drops across the interconnects to adjust the design parameters for at least one interconnect to reduce the voltage drop.

24. A computing device for simulating power distribution from a power source in an electrical system over a sequence of one or more events, comprising:
   a plurality of building block modules implemented on a first computing device, each said module including an interconnect resistance for one or more series-connected physical interconnects and one or more event-driven fixed power levels for a single load, a current meter for each said physical interconnect that calculates a current derating value from design parameters and provides an indicator of whether a load current exceeds the current derating value and a volt meter that provides an indicator of whether a load voltage meets an under voltage specification and an over voltage specification for the load;
   a topology processor that interconnects a battery model with the plurality of building blocks at nodes into an electrical topology for the electrical system, said processor applying a battery voltage to said topology and calculating load voltages and load currents pulled from the power source to the nodes for a single event;
   a battery depletion processor that simulates the battery model to calculate a drop in battery voltage and a total amp-seconds consumed for a single event; and
   a system processor that (a) for each building block, provides the topology processor with battery voltages and the event-driven fixed power levels selected to apply high load current to that block and monitors the current meters to adjust the design parameters of interconnects to satisfy the current derating values and (b) connects the battery depletion processor and topology processor to execute the sequence of events and monitors the voltage meters to iteratively determine a battery voltage that satisfies the under and over voltage specification for all events in the sequence.

25. The computing device of claim 24, wherein in (a) the system processor selects the battery voltage and powers to apply a maximum load current and in (b) the system processor iteratively determines a minimum battery voltage.

* * * * *